United States Patent
Kudou

(10) Patent No.: US 9,318,600 B2
(45) Date of Patent: Apr. 19, 2016

(54) SILICON CARBIDE SEMICONDUCTOR DEVICE AND METHOD FOR MANUFACTURING SAME

(71) Applicant: Panasonic Intellectual Property Management Co., Ltd., Osaka (JP)

(72) Inventor: Chiaki Kudou, Toyama (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/408,052

(22) PCT Filed: Jan. 31, 2014

(86) PCT No.: PCT/JP2014/000504
§ 371 (c)(1),
(2) Date: Dec. 15, 2014

(87) PCT Pub. No.: WO2014/171048
PCT Pub. Date: Oct. 23, 2014

(65) Prior Publication Data
US 2015/0179791 A1    Jun. 25, 2015

(30) Foreign Application Priority Data
Apr. 16, 2013 (JP) ................................. 2013-085397

(51) Int. Cl.
*H01L 29/78* (2006.01)
*H01L 29/739* (2006.01)
(Continued)

(52) U.S. Cl.
CPC ...... *H01L 29/7813* (2013.01); *H01L 21/02164* (2013.01); *H01L 21/02178* (2013.01);
(Continued)

(58) Field of Classification Search
CPC ............ H01L 29/7813; H01L 29/1608; H01L 29/1095; H01L 21/02529; H01L 29/66325; H01L 29/7393; H01L 29/7395; H01L 29/7397; H01L 21/8213; H01L 29/7391
See application file for complete search history.

(56) References Cited

U.S. PATENT DOCUMENTS

| | | | |
|---|---|---|---|
| 2007/0187695 A1* | 8/2007 | Nakamura et al. | 257/77 |
| 2009/0032821 A1 | 2/2009 | Onose et al. | |

(Continued)

FOREIGN PATENT DOCUMENTS

| | | |
|---|---|---|
| EP | 0 345 380 A2 | 12/1989 |
| JP | 06-090002 A | 3/1994 |

(Continued)

OTHER PUBLICATIONS

Carole et al, Study of the Nucleation of p-doped SiC in Selective Epitaxial Growth using VLS Transport, Materials Science Forum, vols. 740-742, Jan. 25, 2013.*

(Continued)

*Primary Examiner* — Joseph C Nicely
(74) *Attorney, Agent, or Firm* — Renner, Otto, Boisselle & Sklar, LLP

(57) ABSTRACT

This silicon carbide semiconductor device includes: a substrate with a principal surface; a silicon carbide layer which is arranged on a side of the principal surface of the substrate and which includes a first impurity region of a first conductivity type; a trench which is arranged in the silicon carbide layer and which has a bottom located in the first impurity region; a trench bottom impurity layer which is arranged in the trench to contact with at least a portion of the bottom of the trench and which is a silicon carbide epitaxial layer of a second conductivity type; a gate insulating film which covers a side surface of the trench and the trench bottom impurity layer; and a gate electrode which is arranged over at least a portion of the gate insulating film that is located inside the trench.

17 Claims, 15 Drawing Sheets

(51) Int. Cl.
- *H01L 29/12* (2006.01)
- *H01L 21/02* (2006.01)
- *H01L 21/311* (2006.01)
- *H01L 29/10* (2006.01)
- *H01L 29/16* (2006.01)
- *H01L 29/167* (2006.01)
- *H01L 29/66* (2006.01)

(52) U.S. Cl.
CPC .... *H01L21/02529* (2013.01); *H01L 21/31111* (2013.01); *H01L 21/31144* (2013.01); *H01L 29/1095* (2013.01); *H01L 29/12* (2013.01); *H01L 29/167* (2013.01); *H01L 29/1608* (2013.01); *H01L 29/66734* (2013.01); *H01L 29/7395* (2013.01); *H01L 29/7397* (2013.01); *H01L 29/78* (2013.01)

(56) References Cited

U.S. PATENT DOCUMENTS

| | | | | |
|---|---|---|---|---|
| 2009/0114923 | A1* | 5/2009 | Iwamuro | 257/77 |
| 2009/0236612 | A1* | 9/2009 | Nakamura et al. | 257/77 |
| 2009/0261350 | A1* | 10/2009 | Yamamoto et al. | 257/77 |
| 2012/0049202 | A1* | 3/2012 | Nakano | 257/77 |
| 2013/0137198 | A1* | 5/2013 | Honke et al. | 438/16 |
| 2013/0341643 | A1* | 12/2013 | Kudou et al. | 257/77 |
| 2014/0264562 | A1* | 9/2014 | Cheng et al. | 257/330 |

FOREIGN PATENT DOCUMENTS

| | | |
|---|---|---|
| JP | 08-056015 A | 2/1996 |
| JP | 10-098188 A | 4/1998 |
| JP | 2001-267570 A | 9/2001 |
| JP | 2009-033036 A | 2/2009 |
| JP | 2009-117649 A | 5/2009 |
| JP | 2009-231545 A | 10/2009 |
| JP | 2010-114163 A | 5/2010 |
| JP | 2010114163 A * | 5/2010 |
| JP | 2012-227324 A | 11/2012 |

OTHER PUBLICATIONS

Thierry-Jebali et al, Electrical Characterization of PiN Diodes with p+ layer Selectively Grown by VLS Transport, Materials Science Forum, vols. 740-742, Jan. 25, 2013.*

Chowdhury et al, High growth rate 4H—SiC epitaxial growth using dichlorosilane in a hot-wall CVD reactor, Journal of Crystal Growth, 316, 2011, pp. 60-66.*

Written Opinion for corresponding International Application No. PCT/JP2014/000504 mailed May 13, 2014.

International Search Report for corresponding International Application No. PCT/JP2014/000504 mailed May 13, 2014.

The 9th European Conference on Silicon Carbide and Related Materials, St. Petersburg, Russia, Sep. 2-6, 2012 (ECSCRM-2012).

D. Carole et al, "Growth mechanism during selective epitaxy of p-doped SiC using VLS transport", MRS Proceedings / vol. 1433 / 2012.

Gabriel Ferro et al, "Growth by a vapour-liquid-solid mechanism: a new approach for silicon carbide epitaxy", New J. Chem., 2004,28, 889-896.

N. Thierry-Jebali et al, "Electrical characterization of PiN diodes fabricated on a p layer selectively grown by VLS transport" ECSCRM-2012, Th9-3.

D. Carole et al, "Study of the Nucleation of p-doped SiC in Selective Epitaxial Growth using VLS Transport", ECSCRM-2012, Tu3-4.

Notice of Reasons for Rejection issued on Nov. 4, 2014 for corresponding Japanese Patent Application No. 2014-540244 and English translation.

* cited by examiner (a)

(b)

(a)

(b)

(a)

(b)

(a)

(b)

(a)

(b)

(a)

(b)

(a)

(b)

(c)

SILICON CARBIDE SEMICONDUCTOR DEVICE AND METHOD FOR MANUFACTURING SAME

TECHNICAL FIELD

The present disclosure relates to a semiconductor device and a method for fabricating the device. More particularly, the present disclosure relates to a silicon carbide semiconductor device which can be used in applications that require a high breakdown voltage and a large amount of current and a method for fabricating such a device.

BACKGROUND ART

Silicon carbide (SiC) has a broader band gap and a higher dielectric breakdown field strength than silicon (Si), and therefore, is expected to be the best semiconductor material to make a next-generation low-loss power device. Silicon carbide has a lot of poly-types including cubic ones such as 3C-silicon carbide and hexagonal ones such as 6H-silicon carbide and 4H-silicon carbide. Among these various poly-types, the one that is used generally to make a practical silicon carbide semiconductor device is 4H-silicon carbide.

Among various power devices that use silicon carbide, field-effect transistors such as a metal-insulator-semiconductor field-effect transistor (which will be hereinafter referred to as a "MISFET") and a metal-semiconductor field-effect transistor (which will be hereinafter referred to as a "MESFET") are known as typical switching elements. And a metal-oxide-semiconductor field-effect transistor (which will be hereinafter referred to as a "MOSFET") is one of those MISFETs.

Such a switching element can switch between ON state in which drain current of several amperes (A) or more flows and OFF state in which the drain current becomes zero by changing the voltage applied to between its gate and source electrode. Also, in the OFF state, such a switching element will achieve as high a breakdown voltage as several hundred volts or more.

As for rectifiers, a Schottky diode, a pn diode and other silicon carbide rectifiers have already been reported and are all expected to be rectifiers that can operate with a huge amount of current and with a high breakdown voltage.

Silicon carbide has a higher dielectric breakdown field strength and a higher thermal conductivity than Si. That is why a power device that uses silicon carbide (which will be hereinafter referred to as a "silicon carbide power device") can have a higher breakdown voltage and will cause smaller loss than a Si power device. That is why if a silicon carbide power device can have as high performance as a Si power device, the silicon carbide power device can have much smaller area and thickness than the Si power device.

To make an even larger amount of current flow through a power device such as a MISFET, it is effective to increase the number of devices integrated per unit area. For that reason, a vertical power MISFET with a trench gate structure has been proposed as a replacement for a conventional planar gate structure. In a MISFET with the trench gate structure, a channel region is defined on the side surface of a trench which in formed in a semiconductor layer. That is why the unit cell area can be reduced and the number of devices integrated per unit area can be increased.

A vertical MOSFET with such a trench gate structure will now be described as a conventional semiconductor device.

In the conventional semiconductor device, a silicon carbide layer including an N-type drift region and a P-type body region has been formed on a substrate of silicon carbide. An N-type source region is defined in a portion of a surface region of the body region. A trench has been cut to penetrate the source region and the body region and reach the drift region. A gate insulating film has been formed to cover the side surface and bottom of the trench. And a gate electrode has been formed on the gate insulating film so as to fill the trench. A source electrode is arranged on the silicon carbide layer to contact with the source region and the body region. And a drain electrode is arranged on the back surface of the substrate.

In such a vertical MOSFET, when a high voltage is applied to between its source and drain, an electric field easily gets overconcentrated at the bottom of the trench, which is a problem, because the gate insulating film could cause dielectric breakdown at the bottom of the trench. Thus, to avoid such a situation, people proposed that the electric field applied to the bottom of the trench be reduced by defining a P-type region in a portion of the silicon carbide layer which is located under the bottom of the trench. For example, some people proposed that a P-type region be defined by implanting P-type dopant ions into a silicon carbide layer and then a trench be cut to reach the P-type region (see Patent Document No. 1). Meanwhile, other people proposed that a trench be formed in a silicon carbide layer and then a P-type region be defined by implanting P-type dopant ions into the silicon carbide layer through the bottom of the trench (see Patent Document No. 2).

CITATION LIST

Patent Literature

Patent Document No. 1: Japanese Laid-Open Patent Publication No. 2001-267570
Patent Document No. 2: Japanese Laid-Open Patent Publication No. 2009-33036

SUMMARY OF INVENTION

Technical Problem

A non-limiting exemplary embodiment of the present application provides a novel silicon carbide semiconductor device which can reduce such overconcentration of an electric field at the bottom of the trench.

Solution to Problem

To overcome the problem described above, an aspect of the present invention provides a silicon carbide semiconductor device including: a substrate with a principal surface; a silicon carbide layer which is arranged on a side of the principal surface of the substrate and which includes a first impurity region of a first conductivity type; a trench which is arranged in the silicon carbide layer and has a bottom located in the first impurity region; a trench bottom impurity layer which is arranged in the trench to contact with at least a portion of the bottom of the trench and which is a silicon carbide epitaxial layer of a second conductivity type; a gate insulating film which covers the side surface of the trench and the trench bottom impurity layer; and a gate electrode which is arranged over at least a portion of the gate insulating film, the portion of the gate insulating film being located inside the trench.

Another aspect of the present invention provides a method for fabricating a silicon carbide semiconductor device which includes the steps of: (A) providing a substrate having a silicon carbide layer including a first impurity region of a first conductivity type, the silicon carbide layer being arranged on a side of a principal surface; (B) forming a trench in the silicon carbide layer so that a bottom of the trench is located in the first impurity region; (C) forming a stack including a silicon film and an aluminum film on at least a portion of the bottom of the trench; (D) conducting a heat treatment within a gas including carbon and allowing silicon and aluminum in the stack to react with the carbon, thereby forming a trench bottom impurity layer, which is a silicon carbide epitaxial layer of a second conductivity type, on at least the portion of the bottom of the trench; (E) forming a gate insulating film on the side surface of the trench and on the trench bottom impurity layer; and (F) forming a gate electrode on at least a portion of the gate insulating film, the portion of the gate insulating film being located in the trench.

Advantageous Effects of Invention

In a silicon carbide semiconductor device according to an aspect of the present invention, a impurity layer is arranged on the bottom of a trench in order to reduce overconcentration of an electric field, and therefore, it is possible to prevent an electric field from being overconcentrated at the bottom of the trench.

DESCRIPTION OF EMBODIMENTS

Figure 1:
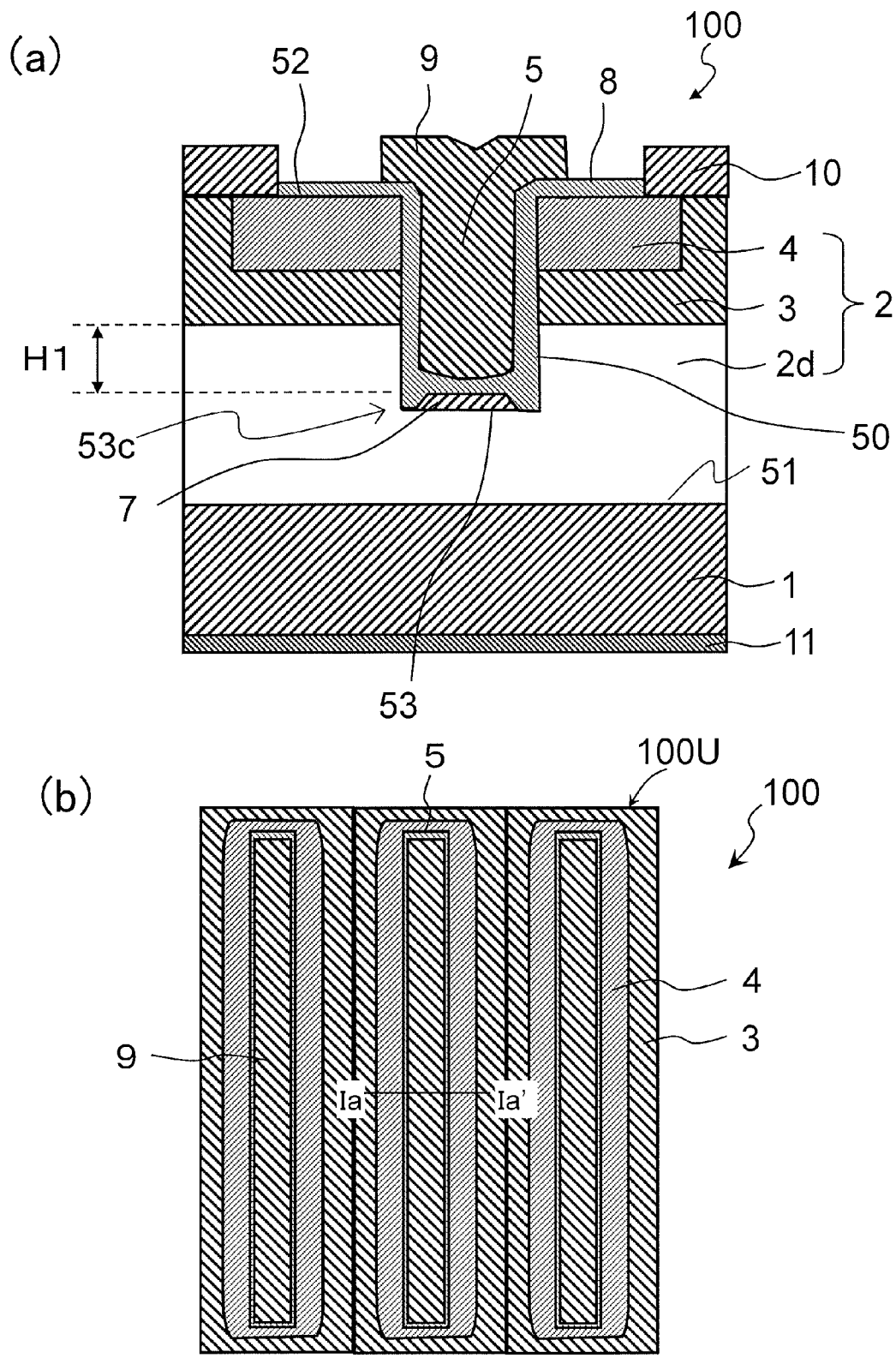
FIG. 1 (*a*) is a cross-sectional view schematically illustrating the structure of a unit cell 100U in a silicon carbide semiconductor device 100 according to a first embodiment. (*b*) is a plan view illustrating an exemplary arrangement of unit cells 100U.
Figure 2:
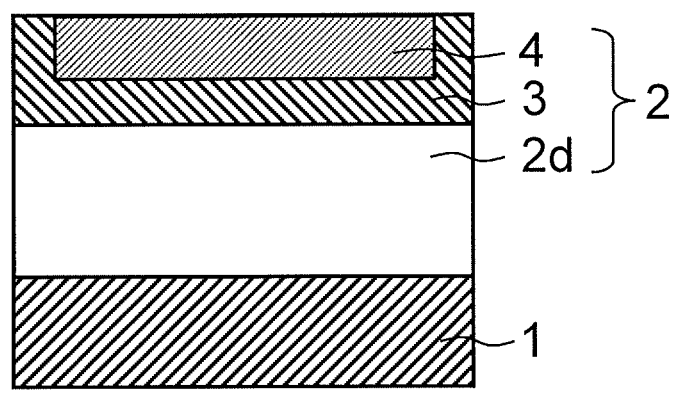
FIGS. 2 (*a*) and (*b*) are cross-sectional views illustrating respective manufacturing process steps to fabricate the silicon carbide semiconductor device 100.
Figure 2:
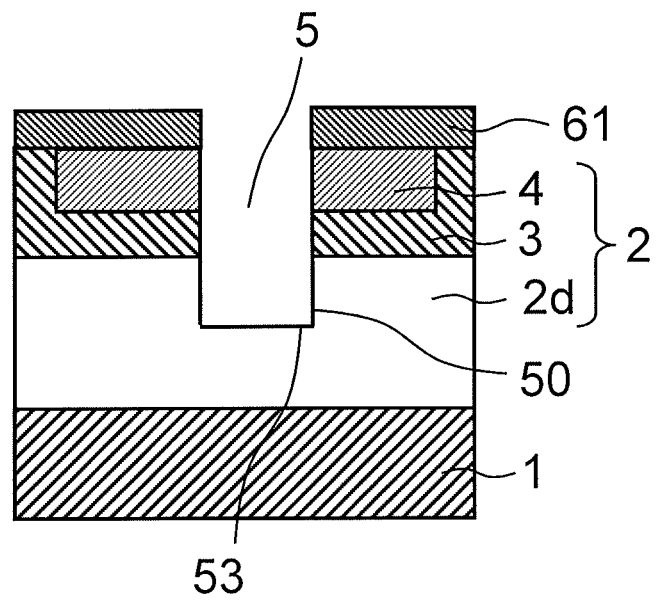
Figure 3:
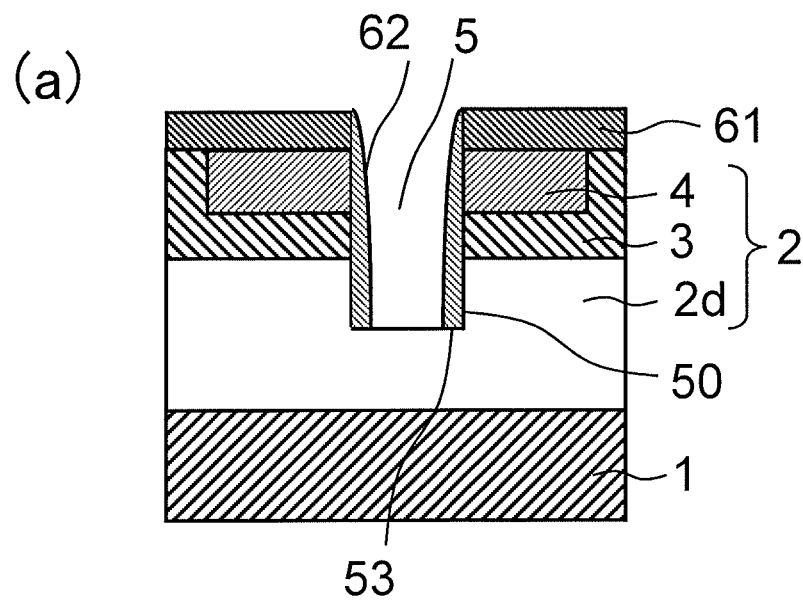
FIGS. 3 (*a*) and (*b*) are cross-sectional views illustrating respective manufacturing process steps to fabricate the silicon carbide semiconductor device 100.
Figure 3:
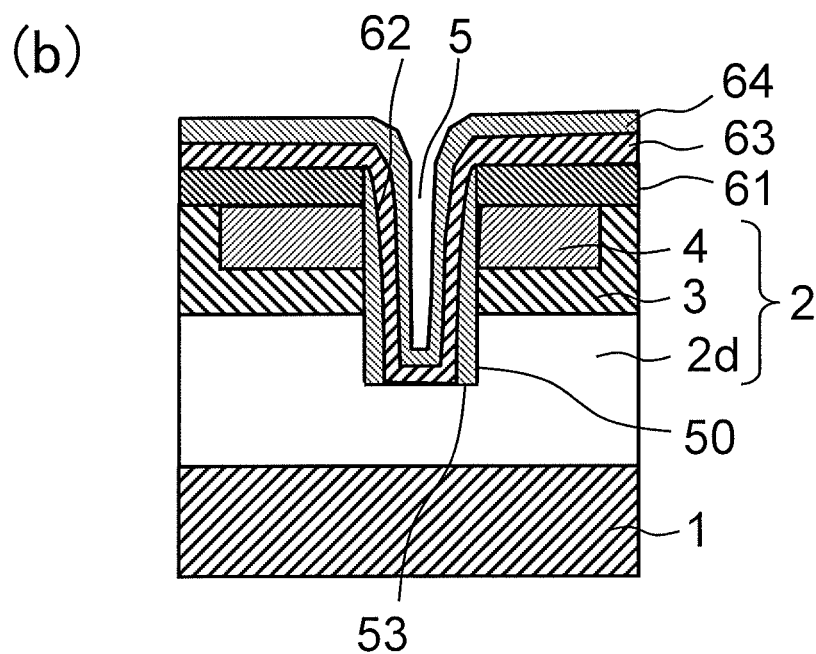
Figure 4:
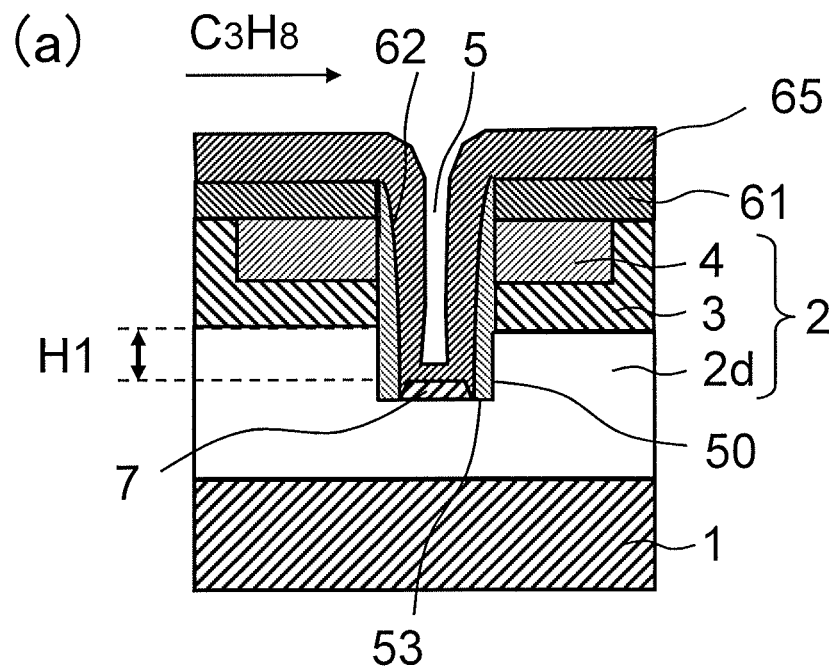
FIGS. 4 (*a*) and (*b*) are cross-sectional views illustrating respective manufacturing process steps to fabricate the silicon carbide semiconductor device 100.
Figure 4:
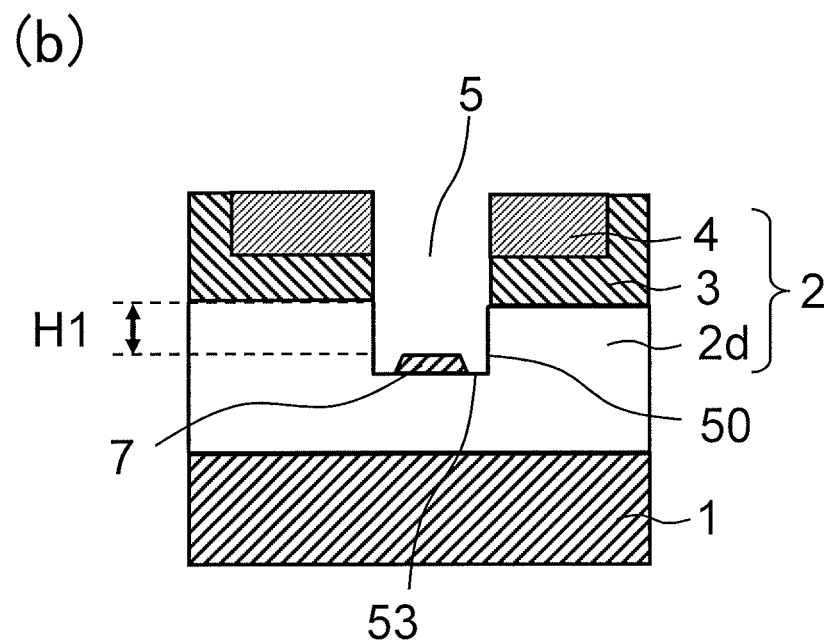
Figure 5:
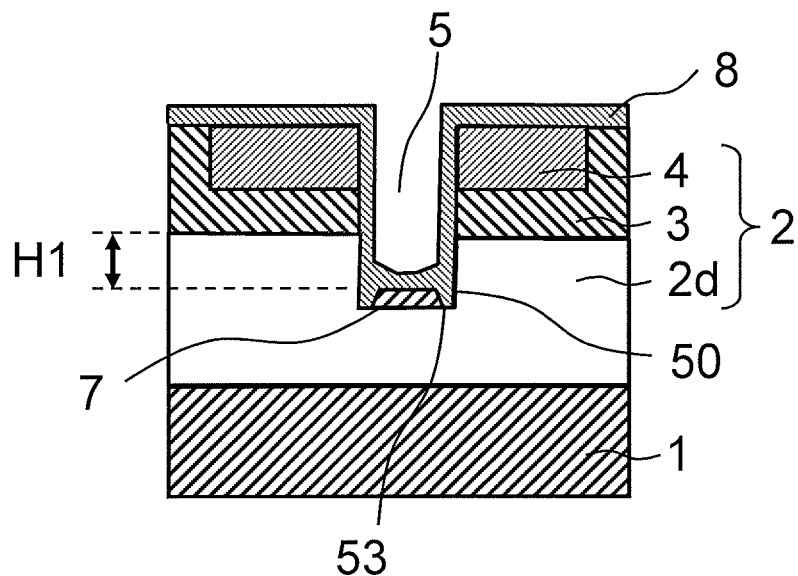
FIGS. 5 (*a*) and (*b*) are cross-sectional views illustrating respective manufacturing process steps to fabricate the silicon carbide semiconductor device 100.
Figure 5:
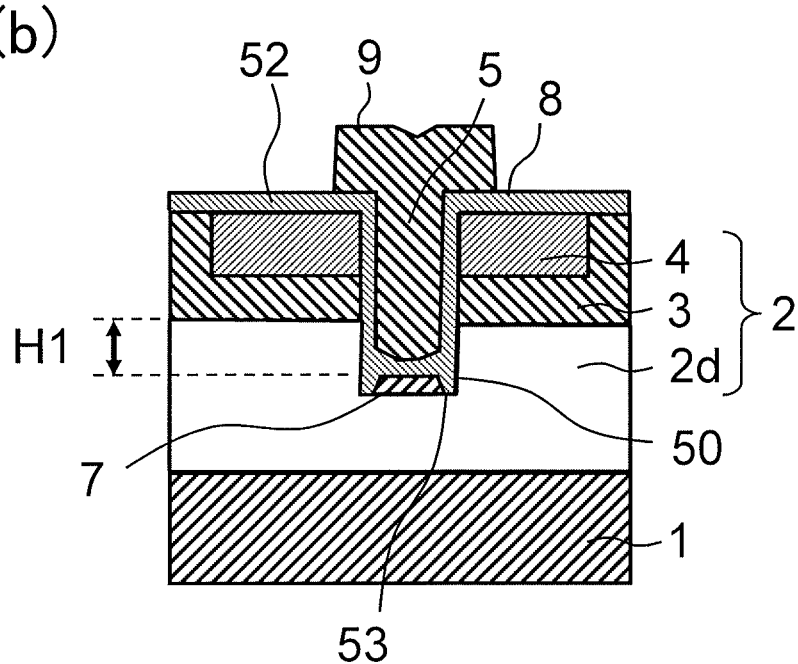

An aspect of the present invention can be outlined as follows.

A silicon carbide semiconductor device according to an aspect of the present disclosure includes: a substrate with a principal surface; a silicon carbide layer which is arranged on a side of the principal surface of the substrate and which includes a first impurity region of a first conductivity type; a trench which is arranged in the silicon carbide layer and which has a bottom located in the first impurity region; a trench bottom impurity layer which is arranged in the trench to contact with at least a portion of the bottom of the trench and which is a silicon carbide epitaxial layer of a second conductivity type; a gate insulating film which covers the side surface of the trench and the trench bottom impurity layer; and a gate electrode which is arranged over at least a portion of the gate insulating film, the portion of the gate insulating film being located inside the trench.

According to such an embodiment, a trench bottom impurity layer made of silicon carbide of a second conductivity type is arranged on at least a portion of a trench's bottom in a transistor with a trench gate structure, and therefore, it is possible to prevent an electric field from being overconcentrated at the bottom of the trench. In addition, since the trench bottom impurity layer is arranged inside the trench, an increase in ON-state resistance, which would be caused if the trench bottom impurity layer were misaligned with the trench, can be minimized.

The trench bottom impurity layer may be out of contact with the side surface of the trench, for example.

According to such an embodiment, a depletion layer to be produced between the trench bottom impurity layer of the second conductivity type and the impurity region of the first conductivity type will expand parallel to the principal surface and will not grow out of the trench from its bottom so easily as in a situation where the trench bottom impurity layer is in contact with the side surface of the trench. That is why compared to the situation where the trench bottom impurity layer is in contact with the side surface of the trench, the current path becomes broader, and therefore, the ON-state resistance can be reduced.

The trench bottom impurity layer may be arranged to cover the bottom of the trench entirely and may be in contact with a portion of the side surface of the trench.

According to such an embodiment, the trench bottom impurity layer is arranged to cover the bottom of the trench entirely, and therefore, the overconcentration of an electric field at the bottom of the trench can be reduced with more certainty.

The trench bottom impurity layer may be arranged only inside the trench. According to such an embodiment, an increase in ON-state resistance, which would be caused if the trench bottom impurity layer were misaligned with the trench, can be checked more securely.

The trench bottom impurity layer may include aluminum as an impurity.

The density of dislocations which extend in the trench bottom impurity layer in its growing direction from the lower surface toward the upper surface of the trench bottom impurity layer may be higher than the density of dislocations which extend in the first impurity region in a growing direction of the epitaxial layer.

According to such an embodiment, a gate insulating film which is thicker than on the side surface of the trench can be formed easily by thermal oxidation over the trench bottom impurity layer. The trench bottom impurity layer with a higher density of dislocations than the first impurity region may be formed selectively at the bottom of the trench by vapor-liquid-solid phase transport method, for example.

A portion of the gate insulating film which is located at a boundary between the bottom and the side surface of the trench may be thicker than another portion of the gate insulating film which is located on the side surface of the trench.

According to such an embodiment, the overconcentration of an electric field can be reduced more effectively in the boundary region between the bottom of the trench and side surface where the electric field comes to have an even higher intensity when a voltage is applied to between the source and drain.

The gate insulating film may be thicker over the trench bottom impurity layer than on the side surface of the trench. According to such an embodiment, the overconcentration of an electric field at the bottom of the trench can be reduced with an intended device characteristic ensured.

The gate insulating film may be a thermal oxide film. According to such an embodiment, the gate insulating film can be thicker over the trench bottom impurity layer than on the side surface of the trench, and therefore, the overconcentration of an electric field at the bottom of the trench can be reduced with an intended device characteristic ensured.

The upper surface of the trench bottom impurity layer may be located under an interface between the drift region and the body region. According to such an embodiment, a current path can be secured in the drift region just as intended.

The silicon carbide semiconductor device may further include a channel layer which is arranged at least between the body region and the gate insulating film and which is made of silicon carbide of the first conductivity type.

The channel layer can achieve the effect of preventing a depletion layer from expanding in the drift region of the first conductivity type between the body region of the second conductivity type and the trench bottom impurity layer of the second conductivity type. That is why by providing the channel layer, the increase in ON-state resistance can be reduced with more certainty.

The silicon carbide semiconductor device may further include a drain electrode which is arranged on the back surface of the substrate and a source electrode which is arranged over the second impurity region and the body region, and the substrate may have the first conductivity type.

According to such an embodiment, an increase in ON-state resistance can be checked and overconcentration of an electric field at the bottom of the trench can be reduced in a vertical MISFET with a trench gate structure.

A method for fabricating a silicon carbide semiconductor device according to an aspect of the present disclosure includes: (A) providing a substrate with a principal surface, on which arranged is a silicon carbide layer including a first impurity region of a first conductivity type; (B) forming a trench in the silicon carbide layer, a bottom of the trench being located in the first impurity region; (C) forming a stack including a silicon film and an aluminum film on at least a portion of the bottom of the trench; (D) conducting a heat treatment within a gas including carbon and allowing silicon and aluminum in the stack to react with the carbon, thereby forming a trench bottom impurity layer, which is a silicon carbide epitaxial layer of a second conductivity type, on at least the portion of the bottom of the trench; (E) forming a gate insulating film on the side surface of the trench and on the trench bottom impurity layer; and (F) forming a gate electrode on at least a portion of the gate insulating film, the portion of the gate insulating film being located inside the trench.

According to such a manufacturing process, silicon carbide is grown epitaxially on at least a portion of a trench's bottom in a transistor with a trench gate structure, and therefore, a trench bottom impurity layer can be formed inside the trench so as to be self-aligned. As a result, an increase in ON-state resistance, which would be caused if the trench bottom impurity layer were misaligned with the bottom of the trench, can be minimized, and overconcentration of an electric field at the bottom of the trench can be reduced. In addition, since there is no need to implant ions into the silicon carbide layer through the trench's surface because the trench bottom impurity layer is provided, the damage that would be caused by ion implantation process can be cut down.

The step (C) of forming a stack may include forming the silicon film on the bottom of the trench and forming the aluminum film on the silicon film.

The method for fabricating a silicon carbide semiconductor device may further include, between the steps (B) and (C), the step of forming a protective film which is arranged on the side surface of the trench and which exposes the bottom of the trench at least partially. In the step (C), the stack may be formed on a portion of the bottom of the trench which is exposed by the protective film and on the protective film. In the step (D), a portion of the stack which is located on the protective film may remain unreacted with the carbon. And the method may further include, between the steps (D) and (E), the step of removing the portion of the stack that remains unreacted with the carbon and the protective film.

According to such an embodiment, the stack consisting of the silicon and aluminum films may be formed so as not to contact with the side surface of the trench. That is why in the process step of forming the trench bottom impurity layer, it is possible to prevent the dopant from diffusing from the stack toward the body region.

The step (C) may include forming the stack on the bottom of the trench and side surface, and the method may include, between the steps (C) and (D), the steps of: forming a mask to cover a portion of the stack which is located on the bottom of the trench; and removing a portion of the aluminum film by etching using the mask.

According to such an embodiment, the aluminum film can be left only around the bottom of the trench, and therefore, in the process step of forming a trench bottom impurity layer, the trench bottom impurity layer may be selectively formed only around the bottom of the trench.

The step (D) may include conducting the heat treatment at a temperature of 1100° C. to 1200° C.

According to such an embodiment, the trench bottom impurity layer can be formed at a lower temperature than in an annealing process to activate the dopant, and therefore, it is possible to prevent the side surface of the trench from roughening.

The gas including carbon may be a mixture of argon and propane gases.

According to such an embodiment, in the process step of forming a trench bottom impurity layer, pyrolysis of the propane gas is produced to melt the silicon and aluminum films included in the stack, and carbon is supplied to the molten film thus formed. The carbon supplied to the molten film diffuses through the molten film and reaches the bottom of the trench. And when the carbon that has reached the bottom of the trench reacts with silicon and aluminum in the molten film, silicon carbide doped with aluminum epitaxially grows selectively at the bottom of the trench.

The step (E) may include forming the gate insulating film by thermally oxidizing a surface portion of the trench and a surface portion of the trench bottom impurity layer.

According to such an embodiment, the gate insulating film can be thicker on the trench bottom impurity layer than on the side surface of the trench, and therefore, the overconcentration of an electric field at the bottom of the trench can be reduced with an intended device characteristic ensured.

The first impurity region may be a drift region. The silicon carbide layer may further include: a body region of the second conductivity type which is arranged over the drift region; and a second impurity region of the first conductivity type which is arranged over the body region. The step (B) may include forming a trench, the trench penetrating the second impurity region and the body region to reach the inside of the drift region.

The method for fabricating a silicon carbide semiconductor device may further include, between the steps (D) and (E), the step of forming a channel layer which is made of silicon carbide of the first conductivity type on the body region that forms a part of the side surface of the trench.

The channel layer can achieve the effect of preventing a depletion layer from expanding in the drift region of the first conductivity type between the body region of the second conductivity type and the trench bottom impurity layer of the second conductivity type. That is why by providing the channel layer, the increase in ON-state resistance can be reduced with more certainty.

Optionally, in the process step of forming a trench bottom impurity layer, an etching process may be performed in hydrogen ambient after the heat treatment has been carried out. According to such an embodiment, even if a semiconductor layer of a second conductivity type has been formed unintentionally on the side surface of the trench, the semiconductor layer of the second conductivity type can be removed from the side surface of the trench by performing the etching process in the hydrogen ambient.

Embodiment 1

Structure of Silicon Carbide Semiconductor Device

Hereinafter, an exemplary silicon carbide semiconductor device according to a first embodiment of the present disclosure will be described with reference to the accompanying drawings. In the following example, the silicon carbide semiconductor device is supposed to be a MISFET with a plurality of unit cells.

FIG. 1(a) schematically illustrates an exemplary cross-sectional structure of a single unit cell 100U in a silicon carbide semiconductor device according to this embodiment. FIG. 1(b) schematically illustrates an exemplary planar layout of a plurality of (e.g., three in this example) unit cells 100U on the surface of the silicon carbide layer 2 of the silicon carbide semiconductor device 100. FIG. 1(a) is a cross-sectional view as viewed on the plane Ia-Ia' shown in FIG. 1(b). FIG. 1(b) illustrates the arrangement of a body region 3, a source region 4, gate electrodes 9 and trenches 5 with illustration of some other members omitted. In this example, the unit cell 100U and trenches 5 have a rectangular planar shape. However, the unit cells and trenches may also have a square, polygonal or any other appropriate shape as well.

This silicon carbide semiconductor device 100 has been fabricated with a substrate 1. As the substrate 1, an N-type (first conductivity type) silicon carbide substrate, of which the principal surface 51 is a (0001) Si plane, may be used. However, this is just an example. Alternatively, the substrate 1 may also be a silicon carbide substrate, of which the principal surface 51 is a C plane, or a silicon carbide substrate with any poly-type structure. In this embodiment, a 4H-silicon carbide substrate is used as the substrate 1 just as an example.

On the principal surface 51 of the substrate 1, arranged is a silicon carbide layer 2 which may be an epitaxial layer, for example. The silicon carbide layer 2 includes a drift region (i.e., a first impurity region) 2d of a first conductivity type (e.g., N-type in this example), a body region 3 of a second conductivity type (e.g., P-type in this example) which is arranged on the drift region 2d, and a source region (i.e., a second impurity region) 4 of the first conductivity type (N-type) which is defined in an upper part of the body region 3. In this embodiment, the substrate 1 is of the first conductivity type (N-type) and has a higher dopant concentration than the drift region 2d.

In the example illustrated in FIG. 1, the lower surface and outer side surface of the source region 4 are surrounded with the body region 3. In this example, the silicon carbide layer 2 has been grown epitaxially on the substrate 1. However, the silicon carbide layer 2 may also be formed by implanting N-type or P-type dopant ions into a side portion of the principal surface of the substrate 1.

In the silicon carbide layer 2, a trench 5 is formed from the upper surface 52 (which is an Si plane in this example) of the silicon carbide layer 2 to penetrate the body region 3 and source region 4 and reach the drift region 2d. The trench 5 has a bottom 53 and a side surface 50. The bottom 53 of the trench 5 is located in the drift region 2d. Although the side surface of the trench 50 intersects at right angles with the upper surface 52 of the silicon carbide layer 2 in the example illustrated in FIG. 1(a), the side surface of the trench 50 may also define a tilt angle with respect to the upper surface 52 of the silicon carbide layer 2. In this description, a portion that joins the side surface of the trench 50 and bottom 53 together will be hereinafter referred to as a "corner portion" 53c. The angle formed between the side surface of the trench 50 and bottom 53 may be either approximately 90 degrees or greater than 90 degrees. Optionally, the corner portion 53c may be rounded, too.

Inside each of these trenches 5, a trench bottom impurity layer 7 of a second conductivity type (P-type) is arranged so as to contact with at least a portion of the bottom of the trench 53. The trench bottom impurity layer 7 is a silicon carbide epitaxial layer doped with a dopant (such as aluminum) of the second conductivity type (P-type). The upper surface of the trench bottom impurity layer 7 may have an upwardly raised shape, for example. Since the trench bottom impurity layer 7 is arranged on a portion of the bottom of the trench 53 so as to contact with the bottom of the trench 53, the bottom of the trench 53 corresponds to the interface between a drift region 2d and the trench bottom impurity layer 7.

The trench bottom impurity layer 7 is an epitaxial layer which reflects the crystal structure of the drift region 2d, for example, and may be formed by vapor-liquid-solid phase transport method (which will be hereinafter referred to as the "VLS method"), for example. According to this method, after a stack including a silicon film and an aluminum film has been formed inside the trench 5, a heat treatment is conducted in an ambient including carbon. As a result, silicon and aluminum in the stack reacts with carbon, thus growing silicon carbide epitaxially from the surface of the trench 5. In this manner, a silicon carbide epitaxial layer doped with aluminum can be obtained. It will be described in further detail later specifically how to form the trench bottom impurity layer 7.

The trench bottom impurity layer 7 that has been formed by VLS method has a larger number of dislocations than the silicon carbide layer 2, for example. The reason will be described below with reference to FIG. 15.

FIG. 15(a) is an enlarged cross-sectional view schematically illustrating the trench bottom impurity layer 7 of this embodiment that has been formed by VLS method. As shown in FIG. 15(a), the trench bottom impurity layer 7 may be arranged on only a portion of the bottom of the trench 53 and may be out of contact with the side surface of the trench 50. The trench bottom impurity layer 7 has been formed by epitaxially growing silicon carbide upward from the bottom of the trench 53 using the drift region at the bottom of the trench 53 as the base and inheriting the drift region's crystal structure. The dislocations to be produced around the bottom of the trench 53 during the epitaxial growth are inherited in the growing direction, thus forming linear dislocations D extending in the growing direction. As a result, dislocations D extending in the growing direction from the lower surface toward the upper surface of the trench bottom impurity layer 7 are produced in the trench bottom impurity layer 7 as shown in FIG. 15(a). The density of such dislocations D is higher there than in the drift region.

It should be noted that the trench bottom impurity layer 7 is formed in a region where the stack including silicon and aluminum films is in contact with the silicon carbide layer (i.e., the surface of the trench 5). If the stack is in contact with not only the bottom of the trench 53 but also a lower portion of the side surface of the trench 50, then silicon carbide grows epitaxially from the bottom of the trench 53 and side surface 50, thus forming a trench bottom impurity layer 7 as shown in FIG. 15(b). In that case, dislocations are produced easily at a corner portion 53c of the trench 5. Consequently, the density of dislocations D in the trench bottom impurity layer 7 becomes higher on the corner portion 53c than on the bottom of the trench 53. Even if the corner portion 53c of the trench 5 is rounded, an increased number of dislocations will also be produced at the corner portion 53c.

In the examples illustrated in FIGS. 15(a) and 15(b), the bottom of the trench 53 is flat. However, the trench 5 does not always have such a shape. Alternatively, the bottom of the trench 53 may be downwardly raised or depressed as shown in FIG. 15(c). In that case, the bottom of the trench 53 has a larger surface area than in the situation where the bottom of the trench 53 is flat. That is to say, when the trench bottom impurity layer 7 is formed, crystals of silicon carbide will start to grow at an increased number of spots. Consequently, compared to the situation where the bottom of the trench 53 is flat, the number of dislocations D produced in the trench bottom impurity layer 7 increases.

Also, the upper surface of the trench bottom impurity layer 7 may be located under the interface between the drift region 2d and the body region 3. In other words, the depth of the upper surface of the trench bottom impurity layer 7 as measured from the upper surface 52 of the silicon carbide layer 2 may be greater than the depth of the interface between the drift region 2d and the body region 3 as measured from the upper surface 52 of the silicon carbide layer 2. In that case, to secure a current path as intended, the interval H1 between the upper surface of the trench bottom impurity layer 7 and the bottom of the body region 3 may be set to be equal to or greater than 0.1 μm, for example, on the side surface of the trench 50.

Inside the trench 5, a gate insulating film 8 is arranged so as to cover at least the side surface of the trench 50 and the trench bottom impurity layer 7. In the example illustrated in FIG. 1(a), the gate insulating film 8 is arranged to contact with a portion of the upper surface 52 of the silicon carbide layer 2 (i.e., a portion of the upper surface 52 which is located around the periphery of the trench 5), or a portion of the upper surface of the source region 4. The gate insulating film 8 is either a silicon dioxide film formed by thermal oxidation or a silicon dioxide film including nitrogen (N). The gate insulating film 8 is thicker at the boundary (i.e., the corner portion 53c) between the bottom of the trench 53 and side surface 50 than on the side surface of the trench 50. The reason is that around the boundary between the bottom of the trench 53 and side surface 50, the thermal oxide film growing from the side surface of the trench 50 joins the thermal oxide film growing from the trench bottom impurity layer 7. Although the gate insulating film 8 is supposed to be formed by thermal oxidation according to this embodiment, the gate insulating film 8 may also have a similar shape even when formed by a deposition method such as a chemical vapor deposition (CVD) process.

Also, inside the trench 5, a gate electrode 9 is arranged on the gate insulating film 8. In this example, the gate electrode 9 is arranged to fill the trench 5 fully. Optionally, the gate electrode 9 may be extended onto the upper surface 52 of the silicon carbide layer 2. Alternatively, the gate electrode 9 may also be buried to fill only a part of the trench 5 which is located under the upper surface 52. The gate electrode 9 just needs to cover a portion of the side surface of the trench 50 on the body region 3. The gate electrode 9 and the silicon carbide layer 2 are insulated from each other by the gate insulating film 8.

A source electrode 10 is arranged on the body region 3 and source region 4 so as to contact with both of the body region 3 and source region 4. On the back surface of the substrate 1, arranged is a drain electrode 11.

The unit cell 100U of the silicon carbide semiconductor device 100 is an MISFET with such a trench gate structure.

In this structure, when the source electrode 10 is connected to a ground potential and a bias voltage which is negative with respect to the threshold value is applied to the gate electrode 9, holes are induced and stored in the vicinity of the interface between the body region 3 and the gate insulating film 8 in the region between the source region 4 and the drift region 2d. This is an OFF state in which no current flows because the path of electrons that are conduction carriers is cut off. In this case, if a high voltage is applied to between the drain electrode 11 and the source electrode 10 so that the drain electrode 11 has positive potential, then the PN junction between the body region 3 and the drift region 2d becomes reverse-biased. As a result, a depletion layer expands in the body region 3 and in the drift region 2d and a high voltage is maintained.

Figure 13:
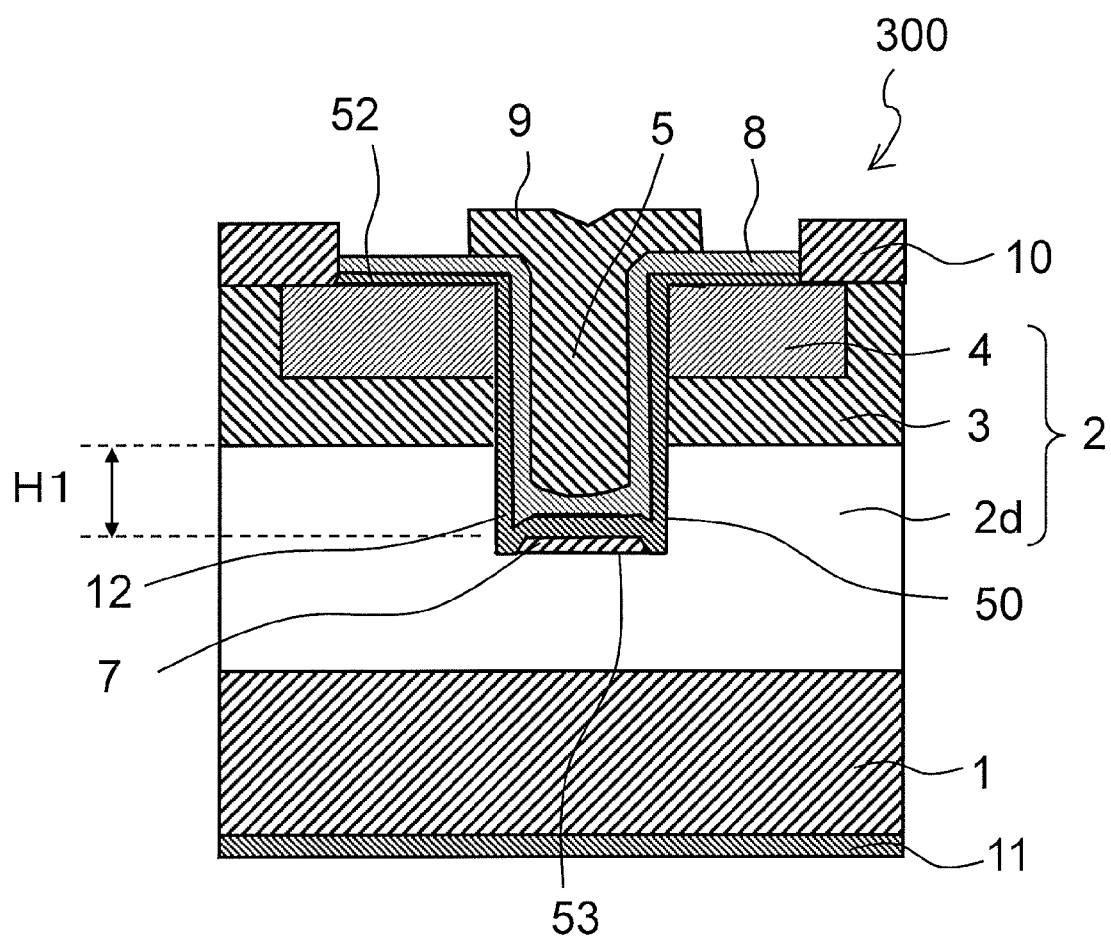
FIG. 13 A cross-sectional view schematically illustrating the structure of a unit cell in a silicon carbide semiconductor device 300 according to the second embodiment.

On the other hand, if a positive bias voltage that is equal to or higher than a threshold voltage is applied to the gate electrode 9, electrons are induced and inverted in the vicinity of the interface between the body region 3 and the gate insulating film 8 in the region between the source region 4 and the drift region 2d, and an inversion layer is formed there. This is an ON state in which carriers flow from the source electrode 10 toward the drain electrode 11 by way of the source region 4, the inversion layer (not shown), the drift region 2d and the substrate 1. In the case of a MISFET with a channel layer of the first conductivity type (e.g., N type), electrons will be stored highly densely in the channel layer, and therefore, current will flow through the channel layer as shown in FIG. 13.

Figure 15:
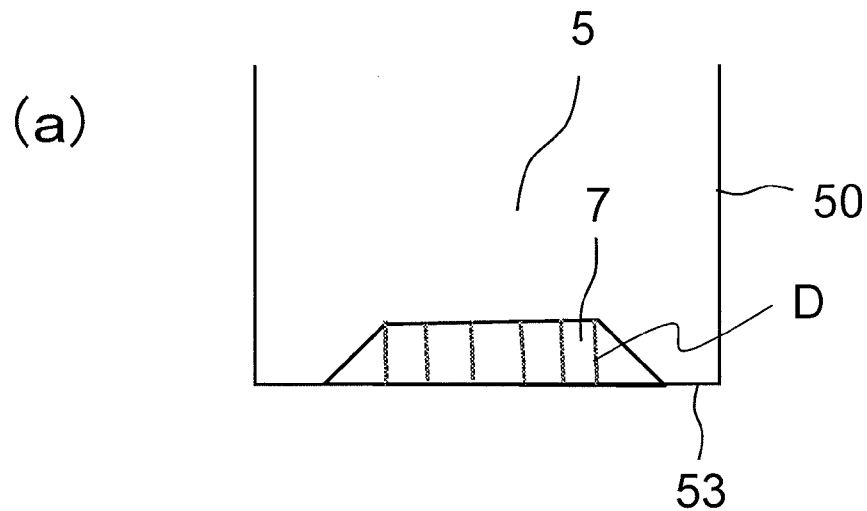
FIG. 15 (*a*) to (*c*) are enlarged cross-sectional views schematically illustrating how dislocations are produced in a trench bottom impurity layer 53.
Figure 15:
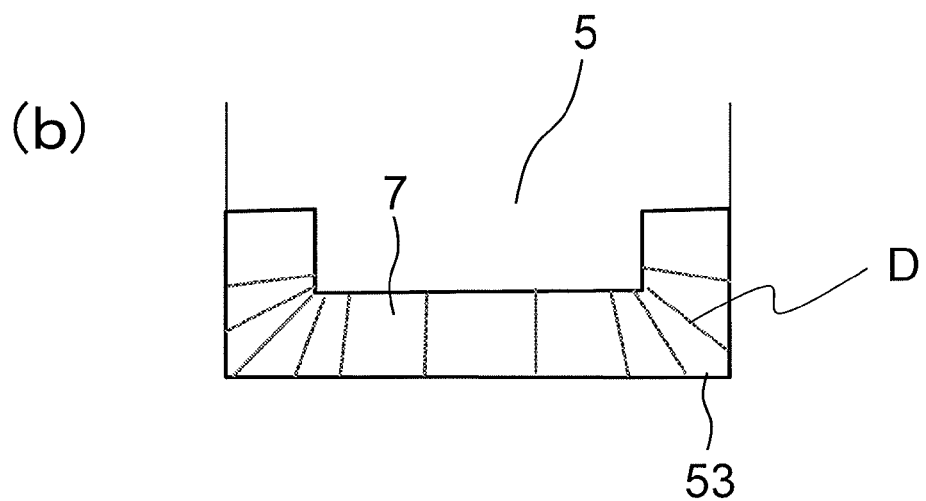
Figure 15:
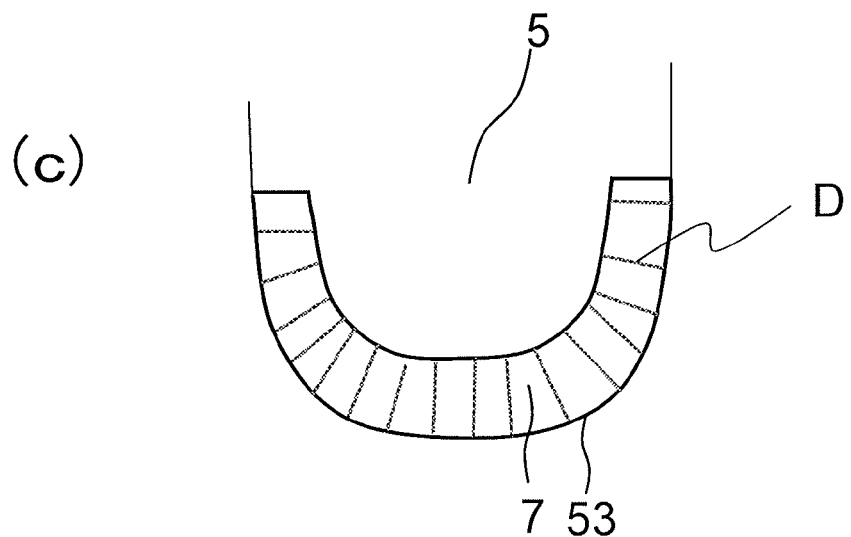

As already described with reference to FIG. 15, the trench bottom impurity layer 7 that has been formed by VLS method, for example, has a larger number of dislocations D than the silicon carbide layer 2. The larger the number of dislocations D produced in silicon carbide, the higher the growth rate of an oxide film to be formed when silicon carbide is thermally oxidized. That is why if the gate insulating film 8 has been formed by thermal oxidation, the gate insulating film 8 arranged over the trench bottom impurity layer 7 will be thicker than a gate insulating film which would be arranged on the bottom of the trench 53 were it not for the trench bottom impurity layer 7. Also, the gate insulating film 8 arranged over the trench bottom impurity layer 7 becomes thicker than the gate insulating film 8 arranged on the side surface of the trench 50. Furthermore, if the bottom of the trench 53 is raised or depressed (see FIG. 15(c)), a larger number of dislocations D will be produced in the trench bottom impurity layer 7 than in a situation where the bottom of the trench 53 is flat. As a result, a thicker gate insulating film 8 may be formed over the trench bottom impurity layer 7.

In the silicon carbide semiconductor device 100 of this embodiment, a trench bottom impurity layer 7 of the second conductivity type (P-type) is arranged on at least a portion of the bottom of the trench 53. Thus, even when a high voltage is applied to between the source and drain, overconcentration of an electric field at the bottom of the trench 53 can be reduced. As a result, the breakdown voltage of the MISFET can be kept sufficiently high and its breakdown can be avoided.

Also, in the embodiment described above, the trench bottom impurity layer 7 is arranged in the trench 5. That is why an increase in ON-state resistance which would be caused when the N-type drift region 2d got depleted between the P-type body region 3 and the P-type trench bottom impurity layer 7 can be checked as will be described later.

According to the method disclosed in Patent Document No. 1, for example, after a P-type region has been defined by ion implantation, a trench is cut. That is why misalignment easily occurs between the P-type region and the trench. As a result, the P-type region may be missing from one end of the bottom of the trench and the electric field may be overconcentrated at that end portion to possibly cause dielectric breakdown there. Meanwhile, at the other end of the bottom of the trench, the P-type region will grow out of the bottom of the trench parallel to the principal surface of the substrate, and therefore, an increased percentage of the N-type drift region will get depleted between the P-type region of that portion and the P-type body region. As a result, the parasitic resistance component (i.e., junction FET (JFET) resistance component) may increase so much as to cause an increase in the ON-state resistance of the semiconductor device. Optionally, to arrange the P-type region at the bottom of the trench more securely, the width of the P-type region may be set to be broader than that of the bottom of the trench. In that case, however, the parasitic resistance component will increase more easily. On the other hand, since the trench bottom impurity layer 7 is arranged inside the trench 5 according to this embodiment, such an increase in ON-state resistance due to misalignment can be avoided. Also, the width of the trench bottom impurity layer 7 becomes equal to or smaller than that of the trench 5. For example, in the example illustrated in FIG. 1, the trench bottom impurity layer 7 does not overlap with the body region 3 when viewed along a normal to the substrate 1. Consequently, an increase in ON-state resistance which would be caused if the N-type drift region 2d got depleted between the P-type body region 3 and the P-type trench bottom impurity layer 7 can be minimized.

In the silicon carbide semiconductor device 100 of this embodiment, the trench bottom impurity layer 7 is out of contact with the side surface of the trench 50. That is why a depletion layer to be produced between the P-type trench bottom impurity layer 7 and the N-type drift region will expand parallel to the upper surface 52 of the silicon carbide layer but will not grow out of the trench 5 from its bottom so easily as in a situation where the trench bottom impurity layer 7 is in contact with the side surface of the trench 50. Consequently, compared to the situation where the trench bottom impurity layer 7 is in contact with the side surface of the trench 50, the current path becomes broader, and therefore, the ON-state resistance can be reduced more effectively.

Also, in the silicon carbide semiconductor device 100, a portion of the gate insulating film 8 which is located at the boundary between the bottom of the trench 53 and side surface 50 may be thicker than another portion of the gate insulating film 8 which is located on the side surface of the trench 50. Thus, the overconcentration of an electric field can be reduced more effectively at the corner portion 53c on the bottom of the trench where the electric field comes to have an even higher intensity when a voltage is applied to between the source and drain. As a result, the breakdown voltage of the MISFET can be kept sufficiently high and its breakdown can be avoided.

Method for Fabricating Silicon Carbide Semiconductor Device

As described above, a trench bottom impurity layer (which is an epitaxially grown layer of a second conductivity type) is selectively formed according to this embodiment on the bottom of the trench by performing an epitaxial growth process using the VLS method.

An exemplary method for fabricating a silicon carbide semiconductor device 100 according to this embodiment will now be described with reference to FIGS. 2 to 6.

First of all, as shown in FIG. 2(a), a substrate 1, of which the principal surface is covered with a silicon carbide layer 2 including a drift region 2d, a body region 3 and a source region 4, is provided.

A 4H-silicon carbide substrate of a first conductivity type (e.g., N-type) which defines an off-axis angle of 4 degrees with respect to a (0001) plane may be used as an exemplary substrate 1. On a (0001) Si plane of this substrate 1, an N-type silicon carbide layer 2 is grown epitaxially. The silicon carbide layer 2 may have a carrier concentration of $8 \times 10^{15}$ cm$^{-3}$ and a thickness of 12 µm, for example. Nitrogen may be used as an N-type dopant.

Thereafter, a P-type body region 3 is defined in the surface region of the silicon carbide layer 2. The body region 3 may have a carrier concentration of $2 \times 10^{18}$ cm$^{-3}$ and a thickness of 1.2 µm, for example. The body region 3 can be formed by implanting P-type dopant ions into the silicon carbide layer 2. For example, Al ions may be used as the P-type dopant ions. The rest of the silicon carbide layer 2, in which the body region 3 has not been formed, becomes the drift region 2d.

Optionally, the body region 3 may be formed on the N-type silicon carbide layer 2 by being epitaxially grown with a P-type dopant (such as trimethylaluminum) supplied.

Next, an N-type source region 4 is defined in an upper part of the body region 3. The source region 4 may have a carrier concentration of $5 \times 10^{19}$ cm$^{-3}$ and a thickness of 0.6 µm, for example. The source region 4 may be formed by implanting N-type dopant ions into the body region 3 through a mask layer (not shown) of silicon dioxide or polysilicon which is arranged on the silicon carbide layer 2. For example, N ions may be used as the N-type dopant ions.

After that, an annealing process is carried out at a temperature of 1700° C. for approximately 30 minutes within an inert gas ambient. By performing this annealing process, the dopants that have been implanted into the body region 3 and source region 4 are activated.

Next, a trench 5 is formed in the silicon carbide layer 2 as shown in FIG. 2(b). In this example, the trench 5 is cut to penetrate the source region 4 and the body region 3 and to have a bottom 53 in the drift region 2d.

First of all, a mask 61 such as a plasma oxide film is formed selectively on the source region 4 and the silicon carbide layer 2 is etched by performing a reactive ion etching (RIE) process using that mask 61. In this manner, a trench 5 (with a depth of 1.5 μm and a width of 1 μm, for example) is formed in the silicon carbide layer 2.

In the example illustrated in FIG. 2(b), the sidewall 50 of the trench 5 is substantially perpendicular to the principal surface of the substrate 1. However, the side surface of the trench 50 may also be tilted with respect to a normal to the principal surface of the substrate 1. That is to say, the trench 5 may have either a tapered shape or an inverted tapered shape, of which the width changes in the height direction.

Next, as shown in FIG. 3(a), a sidewall to be a protective film 62 is formed out of an insulating film so as to cover the side surface of the trench 50. Specifically, after a silicon dioxide film or a silicon nitride film has been deposited by CVD process, the film is etched back by performing an RIE process using a CF3 gas, for example, thereby leaving a sidewall on only the side surface of the trench 50. In this process step, the etching process time is adjusted so that at least a portion of the mask 61 is left. The protective film 62 just needs to be formed so as to cover at least the body region 3 on the side surface of the trench and to expose the bottom of the trench 53 at least partially.

Subsequently, as shown in FIG. 3(b), a stack of a silicon film 63 and an aluminum film 64 is formed on the bottom of the trench 53. In this example, a silicon film 63 may be deposited by CVD process, for example, over the bottom of the trench 53, the protective film 62 and the mask 61 and then an aluminum film 64 may be deposited on the silicon film 63 by sputtering process, for example. In this manner, a stack consisting of the silicon film 63 and the aluminum film 64 is formed on the bottom of the trench 53. It does not matter whether the silicon film 63 is made of polysilicon or amorphous silicon. The aluminum film 64 may be doped with a dopant. The silicon film 63 and the aluminum film 64 may each have a thickness of 200 nm, for example. In this embodiment, the stack may be formed to contact with a portion of the bottom of the trench 53 which is exposed through the protective film 62, and may be formed on at least a portion of the bottom of the trench 53 and on the protective film 62.

Next, as shown in FIG. 4(a), a heat treatment is carried out within a gas including carbon, thereby allowing silicon and aluminum included in the stack to react with carbon. As a result, a silicon carbide epitaxial layer of a second conductivity type is formed as a trench bottom impurity layer 7 on at least a portion of the bottom of the trench 53. The silicon carbide epitaxial layer grows in the stack's thickness direction from a portion where the stack contacts with the surface of the trench 5.

Specifically, in a heating furnace to which an argon gas is introduced at a rate of 100 liters per minute and a propane ($C_3H_8$) gas is introduced at a rate of 150 cc per minute, the substrate 1 on which the stack has been formed on the bottom of the trench 53 is heated to a temperature of about 1100° C. to about 1200° C., for example. As a result of heating, the silicon film 63 and aluminum film 64 are melted together to form a molten film 65. In this process step, pyrolysis of $C_3H_8$ in the ambient is produced, thus supplying carbon (C) to the molten film 65. The carbon supplied to the molten film 65 diffuses through the molten film 65 and reaches the bottom of the trench 53. And when the carbon that has reached the bottom of the trench 53 reacts with silicon and aluminum in the molten film 65, silicon carbide doped with aluminum epitaxially grows selectively at the bottom of the trench 53. In this manner, a trench bottom impurity layer 7 is formed selectively only on the bottom of the trench 53. The heating process may be conducted for 30 minutes, for example. In this process step, a portion of the stack (molten film 65) which is located over the protective film 62 does not react with carbon but is left as an unreacted portion. Likewise, an upper portion of the molten film 65 which is located over the bottom of the trench 53 sometimes does not react with carbon but is left as an unreacted portion, too, because the reaction advances from the bottom of the trench 53.

The gas to be introduced does not have to be $C_3H_8$ but may also be any other gas as long as it includes carbon and is decomposed at a temperature of 1100° C. to 1200° C. Although it depends on the annealing condition, the trench's structure, and other factors, the trench bottom impurity layer of this example may have a carrier concentration of the order of $10^{19}$ cm$^{-3}$ to $10^{21}$ cm$^{-3}$ (i.e., from $10^{19}$ cm$^{-3}$ to less than $10^{22}$ cm$^{-3}$). This trench bottom impurity layer 7 lattice-fits with silicon carbide on the bottom of the trench 53 and side surface 50 but is a film including a larger number of dislocations than the silicon carbide layer 2.

By performing the annealing process described above, the trench bottom impurity layer 7 can be formed so as to cover the bottom of the trench 53 at least partially.

To secure a current path, when measured from the upper surface 52 of the silicon carbide layer 2, the upper surface of the trench bottom impurity layer 7 is suitably located deeper than the interface between the body region 3 and the drift region 2d. The interval H1 as measured perpendicularly to the upper surface 52 of the silicon carbide layer 2 from the upper surface of the trench bottom impurity layer 7 to the interface between the body region 3 and the drift region 2d is more suitably equal to or greater than 0.1 μm. Then, a current path can be secured with more certainty.

Next, as shown in FIG. 4(b), the molten film 65 that is left as an unreacted portion is removed by performing a wet etching process using fluonitric acid solution, for example. Subsequently, the protective film 62 and the mask 61 are also removed by performing a wet etching process using fluonitric acid solution, for example.

Next, as shown in FIG. 5(a), a gate insulating film 8 is formed so as to cover the side surface of the trench 50 and the trench bottom impurity layer 7. Optionally, the gate insulating film 8 may be formed not only inside the trench 5 but also on the upper surface 52 of the silicon carbide layer 2 as well.

Specifically, the substrate 1 is washed and then loaded into a thermal oxidation furnace, where the substrate is processed at 1200° C. for half an hour under a dry oxidizing ambient, for example. In this manner, a surface portion of the trench 5 (including the side surface of the trench 50), a surface portion of the trench bottom impurity layer 7 and a surface portion of the silicon carbide layer 2 are thermally oxidized. As a result, a silicon dioxide film (thermal oxide film) is formed as the gate insulating film 8 on the side surface of the trench 50, on the trench bottom impurity layer 7, and on the upper surface 52 of the silicon carbide layer 2. The gate insulating film 8 is formed thicker at the boundary between the bottom of the trench 53 and side surface 50 than on the side surface of the trench 50. The reason is that in the vicinity of the boundary between the bottom of the trench 53 and side surface 50, the oxide film growing on the bottom of the trench 50 joins the oxide film growing from the trench bottom impurity layer 7. Even though the gate insulating film 8 is supposed to be formed in this embodiment by thermal oxidation, even a gate insulating film 8 formed by CVD process, sputtering process or any other deposition process will also have a similar shape.

The trench bottom impurity layer 7 includes a larger number of dislocations than the silicon carbide layer 2. That is why when formed by thermal oxidation process, the gate insulating film 8 stacked on the trench bottom impurity layer 7 becomes thicker than the gate insulating film on the side surface of the trench 50 or the gate insulating film to be formed on the bottom of the trench 53 were it not for the trench bottom impurity layer 7.

Optionally, the silicon dioxide film may be replaced with a silicon dioxide film including nitrogen. In that case, the number of interface levels can be reduced at the interface between the gate insulating film 8 and the body region 3 and an increase in channel mobility can be expected. Also, the gate insulating film 8 may include a film other than the thermal oxide film. Furthermore, the gate insulating film 8 may also be formed by a deposition process other than a CVD process and a sputtering process.

Next, as shown in FIG. 5(b), a gate electrode 9 is formed on the gate insulating film 8. In this example, a gate electrode 9 is formed on the gate insulating film 8 inside the trench 5 and on the upper surface 52 of the silicon carbide layer 2.

Specifically, first of all, phosphorus (P) doped polysilicon is deposited to 1000 nm, for example, over the entire surface of the wafer by low pressure (LP)-CVD process, thereby forming a polysilicon layer (not shown). Next, a rapid thermal annealing (RTA) process is carried out at 1000° C. for about 60 seconds within an inert gas ambient, thereby activating phosphorus. Thereafter, a mask of photoresist, for example (not shown), is formed so as to expose the entire surface but regions over the trenches 5 and over the periphery of the trenches 5. Subsequently, the polysilicon layer is etched by RIE process, thereby forming a gate electrode 9. It should be noted that the gate electrode 9 does not have to have the shape shown in FIG. 5(b) but could be entirely buried in the trench 5. Alternatively, the gate electrode 9 does not have to fill the trench 5 fully but may also be formed at least on the side surface of the trench 50 in the body region 3 with the gate insulating film 8 interposed between them.

Figure 6:
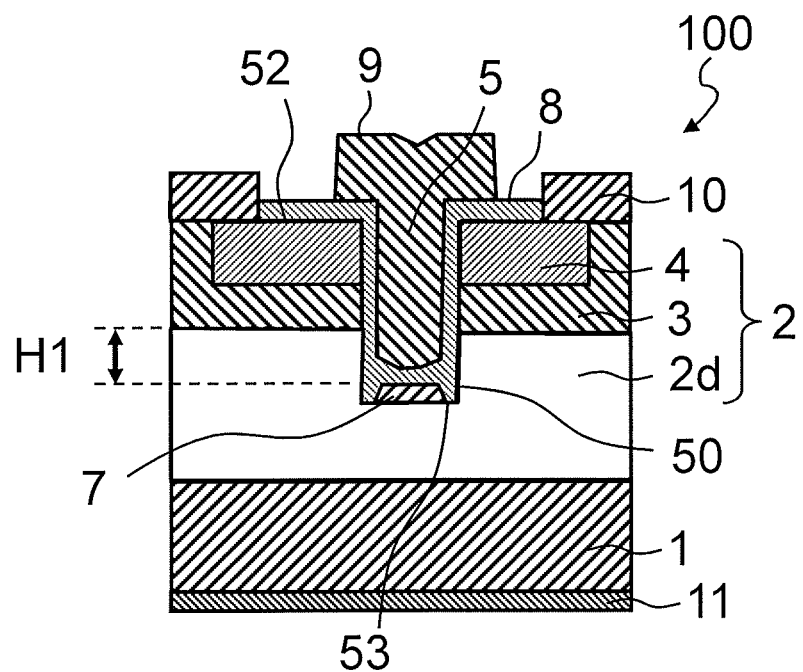
FIG. 6 A cross-sectional view illustrating a manufacturing process step to fabricate the silicon carbide semiconductor device 100.

Next, as shown in FIG. 6, a source electrode 10 is formed to contact with the body region 3 and the source region 4. The source electrode 10 is arranged on the upper surface of the silicon carbide layer 2 to cover both the body region 3 and the source region 4.

Specifically, first of all, an interlayer insulating film (not shown) is deposited over the silicon carbide layer 2 and the gate electrode 9. Next, a hole is cut through the interlayer insulating film to partially expose the source region 4 and the body region 3. Then, the hole is filled with a conductive film of Ti, for example, and an annealing process is performed if necessary. As a result, a source electrode 10 which makes ohmic contact with the source region 4 and the body region 3 can be obtained.

Meanwhile, a drain electrode 11 is formed on the back surface (which is opposite from the principal surface) of the substrate 1.

In this manner, a silicon carbide semiconductor device 100 is obtained as a MISFET with a trench gate structure.

According to such a manufacturing process, a trench bottom impurity layer 7 can be formed inside the trench 5 so as to be self-aligned and to cover the bottom of the trench 53 at least partially. As a result, overconcentration of an electric field at the bottom of the trench 53 can be reduced.

In addition, compared to a situation where a P-type region is defined in a silicon carbide layer by ion implantation (see Patent Documents Nos. 1 and 2), the following advantages can be achieved.

According to the method proposed in Patent Document No. 1, a P-type region is defined in a silicon carbide layer by ion implantation. In that case, misalignment could occur between the trench and the P-type region and the ON-state resistance could increase. On the other hand, since a trench bottom impurity layer is formed inside the trench according to this embodiment, such an increase in ON-state resistance due to misalignment between the bottom of the trench 53 and the trench bottom impurity layer 7 can be checked.

On the other hand, Patent Document No. 2 proposes that a P-type region be defined in a silicon carbide layer by cutting a trench and then implanting dopant ions into the silicon carbide layer through the bottom of the trench. According to such a method, a P-type region can be defined under the trench without causing misalignment. According to the method of Patent Document No. 2, however, ions are implanted after a trench has been cut, and then an annealing process is carried out to activate the dopant implanted. That is why the trench's wall could get damaged by going through the ion implantation process and could have its surface roughened by going through the activating annealing process, which could cause a decrease in channel mobility and in the reliability of the gate insulating film. In contrast, according to this embodiment, there is no need to implant ions into the silicon carbide layer through the bottom or side surface of the trench. Consequently, such damage or surface roughening that would be caused by ion implantation can be minimized.

In addition, according to this embodiment, after a protective film 62 has been formed on the side surface of the trench 50, a stack consisting of a silicon film 63 and an aluminum film 64 is formed. That is why the stack is formed so as to be out of contact with the side surface of the trench 50. As a result, in the process step of forming a trench bottom impurity layer 7, it is possible to prevent a dopant from diffusing from the stack into a surface portion of the body region 3 (i.e., a region where a channel is going to be formed), and therefore, the intended element characteristic is realized with more certainty. It should be noted that the protective film 62 does not have to cover the side surface of the trench 50 entirely. The effects described above can be achieved if at least a portion of the side surface of the trench 50 over the body region 3 is covered with the protective film 62.

Furthermore, a thick gate insulating film 8 is formed at the boundary between the bottom of the trench 53 and side surface 50 and on the upper surface of the trench bottom impurity layer 7. Consequently, overconcentration of an electric field at the bottom of the trench 53 and at a corner portion of the trench 5 can be reduced more securely, and dielectric breakdown of the gate insulating film 8 at the bottom of the trench 53 can be suppressed.

Embodiment 2

Structure of Silicon Carbide Semiconductor Device

Next, an exemplary silicon carbide semiconductor device according to a second embodiment of the present disclosure will be described with reference to the accompanying drawings.

Figure 7:
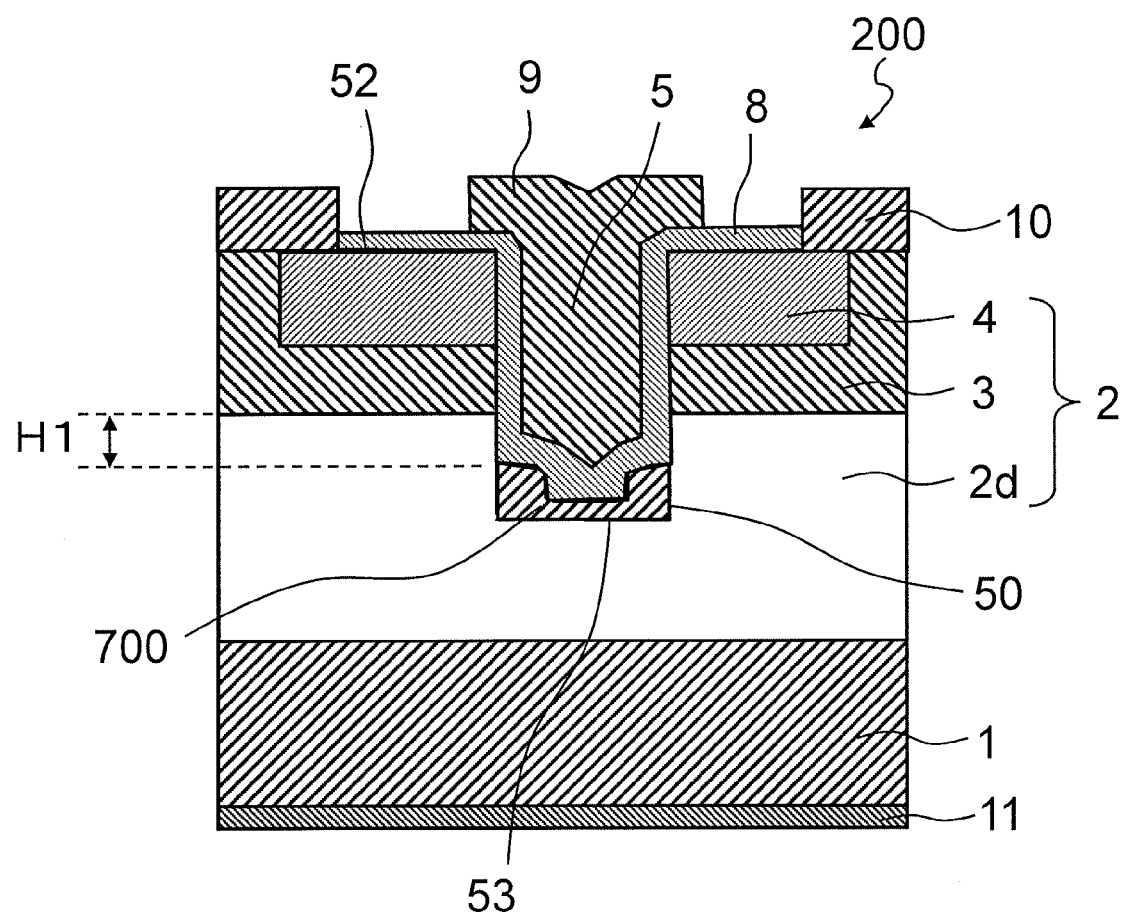
FIG. 7 A cross-sectional view schematically illustrating the structure of a unit cell in a silicon carbide semiconductor device 200 according to a second embodiment.

FIG. 7 is a cross-sectional view schematically illustrating an exemplary cross-sectional structure of a single unit cell in a silicon carbide semiconductor device 200 according to this embodiment. In the silicon carbide semiconductor device 200 of this embodiment, its trench bottom impurity layer 7 has a different shape from its counterpart of the silicon carbide semiconductor device 100 of the first embodiment. In FIG. 7, any component also included in the silicon carbide semiconductor device 100 shown in FIG. 1 and having substantially the same function as its counterpart is identified by the same reference numeral as its counterpart's and description thereof will be omitted herein.

As shown in FIG. 7, in this silicon carbide semiconductor device 200, the trench bottom impurity layer 700 is arranged so as to cover the bottom of the trench 53 not partially but entirely and to contact with the side surface of the trench 50.

In the silicon carbide semiconductor device 200 of this embodiment, the trench bottom impurity layer 7 is arranged so as to contact with the bottom of the trench 53 inside the trench 5. That is why as well as the silicon carbide semiconductor device 100 of the first embodiment, the silicon carbide semiconductor device 200 of this embodiment can also check an increase in ON-State resistance and reduce overconcentration of an electric field at the bottom of the trench 53.

In addition, in this silicon carbide semiconductor device 200, the trench bottom impurity layer 700 covers the bottom of the trench 53 entirely, and therefore, overconcentration of an electric field at the bottom of the trench 53 can be reduced even more effectively.

Method for Fabricating Silicon Carbide Semiconductor Device

Now it will be described how to fabricate a silicon carbide semiconductor device 200 according to this embodiment.

The process step of providing a substrate 1 including a silicon carbide layer 2 and the process step of cutting a trench 5 may be the same as the process steps which are respectively shown in FIGS. 2(a) and 2(b) for the first embodiment, and description thereof will be omitted herein.

Figure 8:
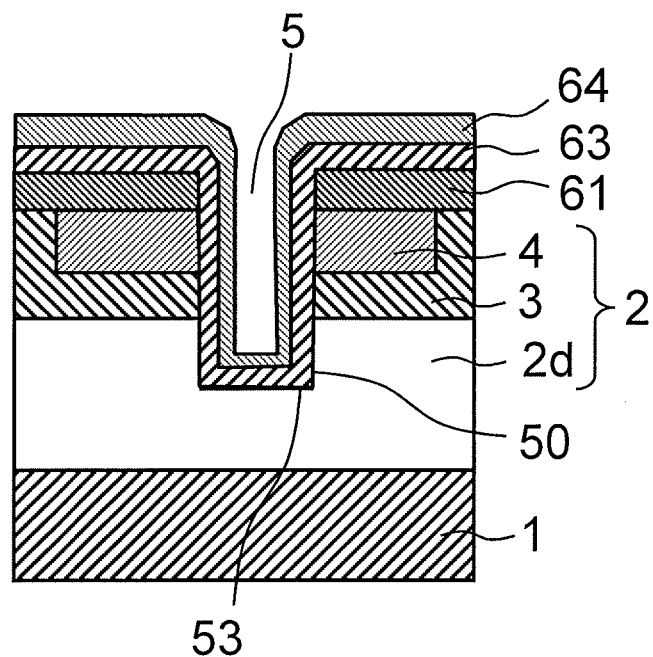
FIGS. 8 (*a*) and (*b*) are cross-sectional views illustrating respective manufacturing process steps to fabricate the silicon carbide semiconductor device 200.
Figure 8:
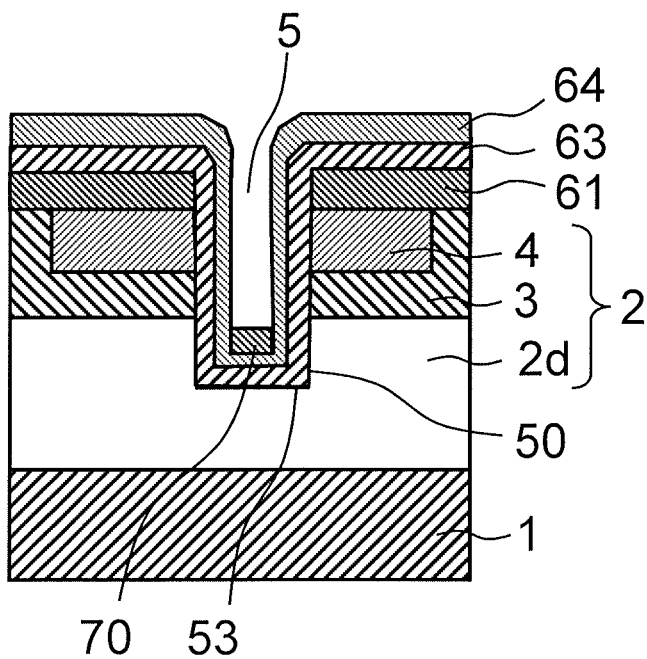

Next, as shown in FIG. 8(a), a stack of a silicon film 63 and an aluminum film 64 is formed on the bottom of the trench 53 and side surface 50.

In this example, a silicon film 63 may be deposited by CVD process, for example, over the bottom of the trench 53 and side surface 50 and the mask 61 and then an aluminum film may be deposited thereon by sputtering process, for example. In this manner, a stack consisting of the silicon film 63 and the aluminum film 64 is formed on the bottom of the trench 53. It does not matter whether the silicon film 63 is made of polysilicon or amorphous silicon. The silicon film 63 and the aluminum film 64 may each have a thickness of 200 nm, for example.

Subsequently, as shown in FIG. 8(b), a mask 70 is formed only on the stack at the bottom of the trench 5.

Specifically, although now shown, a photoresist which is an organic material is applied onto the entire surface of the stack, and then etched back by performing a dry etching process within an oxygen-including gas, thereby forming the mask 70.

Figure 9:
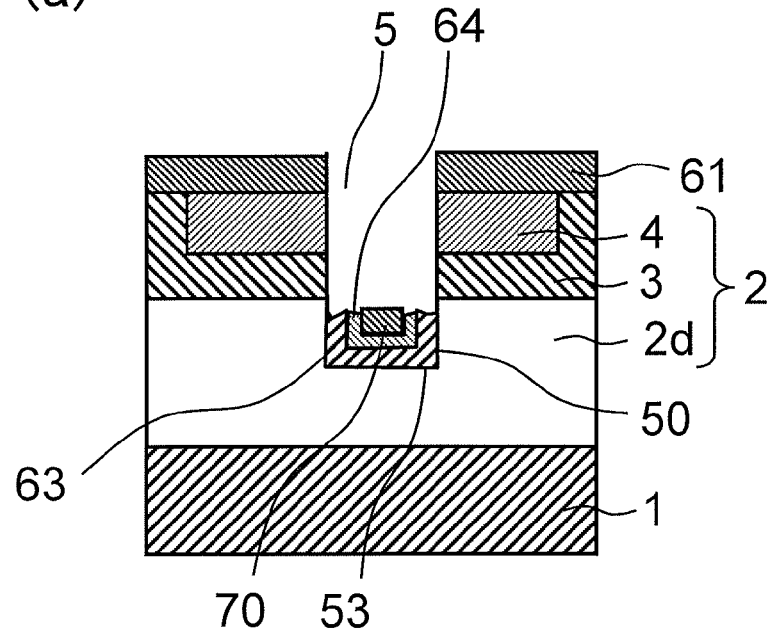
FIGS. 9 (*a*) and (*b*) are cross-sectional views illustrating respective manufacturing process steps to fabricate the silicon carbide semiconductor device 200.
Figure 9:
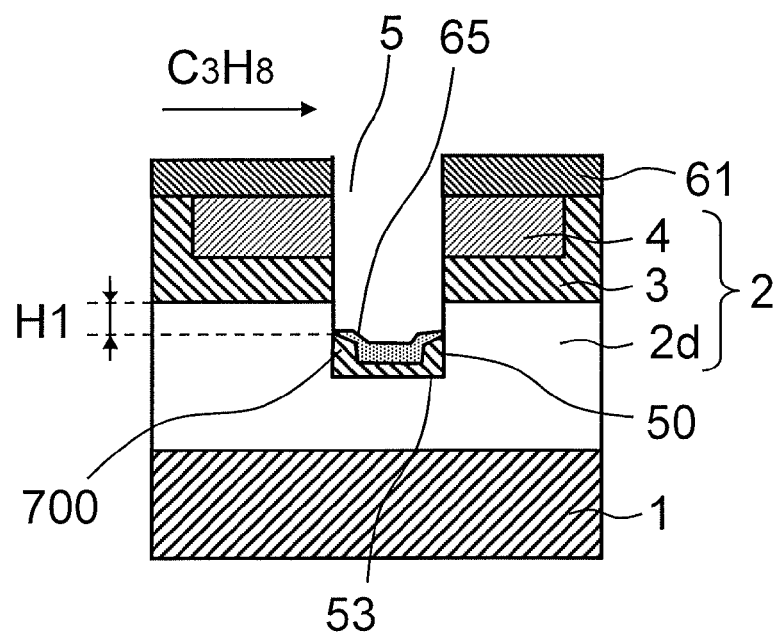

Thereafter, as shown in FIG. 9(a), the stack is selectively removed by performing an etching process using the mask 70. In this embodiment, after the aluminum film 64 has been etched through the mask 70 with a solution including phosphoric acid, for example, the silicon film 63 is etched with a solution including fluonitric acid. In this manner, a stack consisting of the silicon film 63 and the aluminum film is left only on the bottom of the trench 53 and on a portion of the side surface of the trench 50 around the bottom of the trench 53.

Next, as shown in FIG. 9(b), a heat treatment is carried out within a gas including carbon, thereby allowing silicon and aluminum included in the stack to react with carbon. In this manner, a trench bottom impurity layer 700 is formed.

First of all, the mask 70 is removed by being exposed to plasma of a gas including oxygen, for example. Thereafter, in a heating furnace to which an argon gas is introduced at a rate of 100 liters per minute and a $C_3H_8$ gas is introduced at a rate of 150 cc per minute, the substrate 1 on which the stack has been formed on the bottom of the trench 53 is heated to a temperature of about 1100° C. to about 1200° C., for example. As a result of heating, the silicon film 63 and aluminum film 64 are melted together to form a molten film 65. In this process step, pyrolysis of $C_3H_8$ in the ambient is produced, thus supplying carbon (C) to the molten film 65. The carbon supplied to the molten film 65 diffuses through the molten film and reaches the bottom of the trench 53. And when the carbon that has reached the bottom of the trench 53 reacts with silicon and aluminum in the molten film 65, silicon carbide doped with aluminum epitaxially grows selectively at the bottom of the trench 53. In this manner, a trench bottom impurity layer 700 is formed selectively only on the bottom of the trench 53 and on a lower portion of the side surface of the trench 50 around the bottom. The heating process may be conducted for 30 minutes, for example. In this process step, if a silicon carbide substrate, of which the principal surface is either a (0001) plane or a (000-1) plane, is used as the substrate 1, the trench bottom impurity layer 700 on the side surface of the trench 50 will be approximately five times as thick as the trench bottom impurity layer 700 on the bottom of the trench 53.

The gas to be introduced does not have to be $C_3H_8$ but may also be any other gas as long as it includes carbon (C) and is decomposed at a temperature of 1100° C. to 1200° C. Although it depends on the annealing condition, the trench's structure, and other factors, the trench bottom impurity layer 700 of this example may have a carrier concentration of the order of $10^{19}$ cm$^{-3}$ to $10^{21}$ cm$^{-3}$ (i.e., from $10^{19}$ cm$^{-3}$ to less than $10^{22}$ cm$^{-3}$). This trench bottom impurity layer 700 lattice-fits with silicon carbide on the bottom of the trench 53 and side surface 50 but is a film including a lot of dislocations (see FIG. 15(b)).

By performing this heat treatment process, the trench bottom impurity layer 700 can be formed so as to contact with only a lower portion of the side surface of the trench 50 and to cover the bottom of the trench 53 entirely. It should be noted that sometimes part of the stack (molten film 65) does not react with carbon but is left as an unreacted portion. In the example illustrated in FIG. 9, that unreacted portion is left on the trench bottom impurity layer 700.

According to this method, the stack consisting of the silicon film 63 and the aluminum film 64 is formed only around the bottom of the trench 53, and is not formed on a portion of the side surface of the trench 50 over the body region 3. As a result, it is possible to prevent a dopant from being introduced from the stack into a portion of the transistor to be a channel region.

To secure a current path, the upper surface of the trench bottom impurity layer 700 is suitably located under the interface between the body region 3 and the drift region 2d. The interval H1 as measured perpendicularly to the upper surface 52 of the silicon carbide layer 2 from the upper surface of the trench bottom impurity layer 700 to the interface between the body region 3 and the drift region 2d is more suitably equal to or greater than 0.1 μm. Then, a current path can be secured with more certainty.

Figure 10:
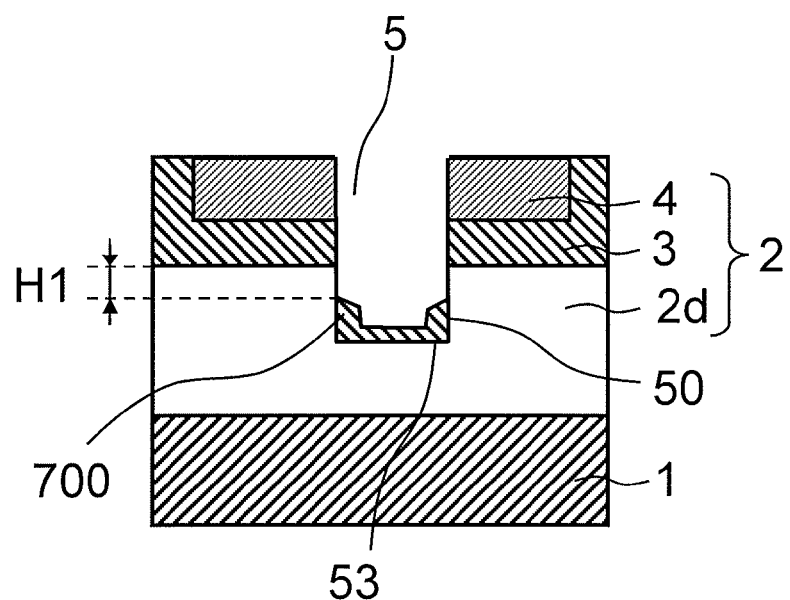
FIGS. 10 (*a*) and (*b*) are cross-sectional views illustrating respective manufacturing process steps to fabricate the silicon carbide semiconductor device 200.
Figure 10:
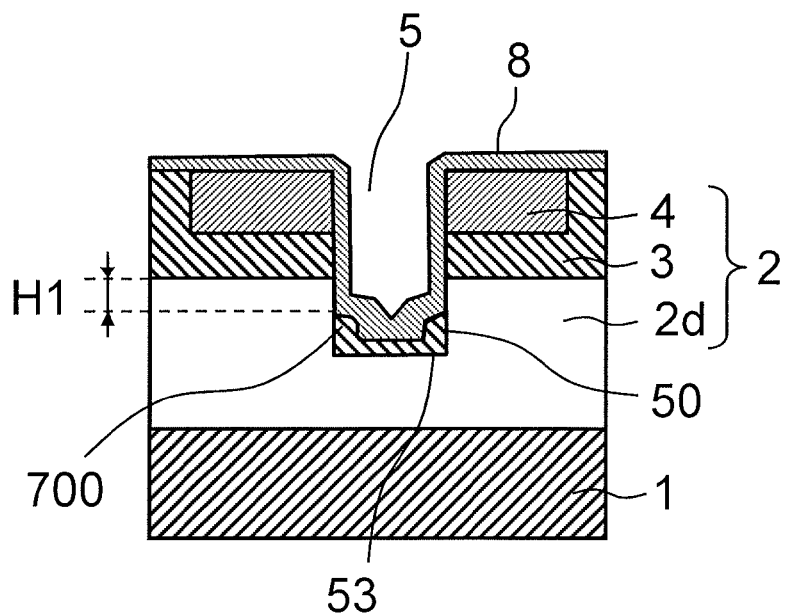

Next, as shown in FIG. 10(a), the molten film 65 that is left as an unreacted portion is removed by performing a wet etching process using fluonitric acid solution, for example. Subsequently, the mask 61 is also removed by performing a wet etching process using fluonitric acid solution, for example.

Next, as shown in FIG. 10(b), a gate insulating film 8 is formed so as to cover the side surface of the trench 50 and the trench bottom impurity layer 700 and the upper surface 52 of the silicon carbide layer 2. It will not be described exactly how to form the gate insulating film 8, because the gate insulating film 8 may be formed in the same way as in the first embodiment described above.

After that, the same manufacturing process steps as the ones illustrated respectively in FIGS. 5(b) and 6 for the first embodiment are performed, and description thereof will be omitted herein.

Figure 11:
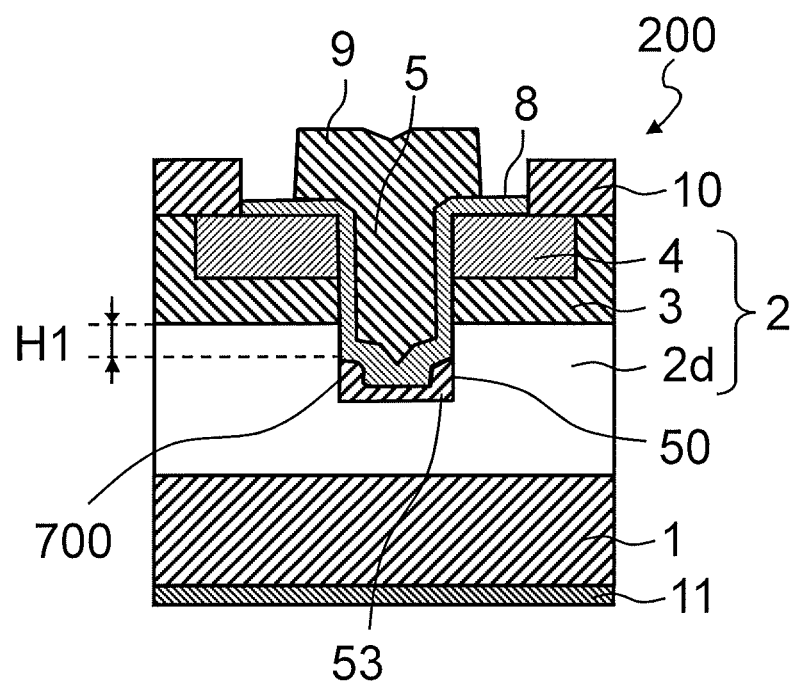
FIG. 11 A cross-sectional view illustrating a manufacturing process step to fabricate the silicon carbide semiconductor device 200.

In this manner, a silicon carbide semiconductor device 200 is obtained as a MISFET with a trench gate structure as shown in FIG. 11.

According to such a manufacturing process, a trench bottom impurity layer 700 can be formed only inside the trench 5 so as to be self-aligned and to cover the bottom of the trench 53. As a result, an increase in ON-state resistance that would be caused if the bottom of the trench 53 were misaligned with the trench bottom impurity layer 700 can be checked and overconcentration of an electric field at the bottom of the trench 53 can be reduced.

Furthermore, a thicker gate insulating film 8 is formed at the boundary between the bottom of the trench 53 and side surface 50 and on the trench bottom impurity layer 700 than on the side surface of the trench 50 (on a portion of the side surface of the trench 50 over the body region 3, in particular). Consequently, overconcentration of an electric field at the bottom of the trench 53 can be reduced more securely, and dielectric breakdown of the gate insulating film 8 at the bottom of the trench 53 can be suppressed.

Also, the trench bottom impurity layer 700 is formed by epitaxially growing silicon carbide selectively on the bottom of the trench 53 and on a portion of the side surface of the trench 50 around the bottom 53. That is why when viewed along a normal to the substrate 1, the trench bottom impurity layer 700 can be approximately as wide as the trench 5. Since the trench bottom impurity layer 700 is formed inside the trench 5, the trench bottom impurity layer 700 does not overlap with the body region 3 when viewed along a normal to the substrate 1. Consequently, an increase in ON-state resistance that would be caused if a portion of the N-type drift region 2d got depleted between the P-type body region 3 and the P-type trench bottom impurity layer 700 can be checked.

Modified Method for Fabricating Silicon Carbide Semiconductor Device

Next, a modified method for fabricating a silicon carbide semiconductor device 200 according to this embodiment will be described.

First of all, a substrate 1 including a silicon carbide layer 2 is provided and a trench 5 is formed in the silicon carbide layer 2. Subsequently, a silicon film 63 and an aluminum film 64 are deposited in this order inside the trench 5 to obtain a stack. After that, a mask 70 which covers the stack is formed at the bottom of the trench 5. The process step of providing a substrate 1 including a silicon carbide layer 2 and the process step of cutting a trench 5 may be the same as the process steps which are respectively shown in FIGS. 2(a) and 2(b) for the first embodiment. And the process step of forming a stack consisting of a silicon film 63 and an aluminum film 64 and the process step of forming a mask 70 may be the same as the process steps which are respectively shown in FIGS. 8(a) and 8(b) for the second embodiment. And description thereof will be omitted herein.

Figure 12:
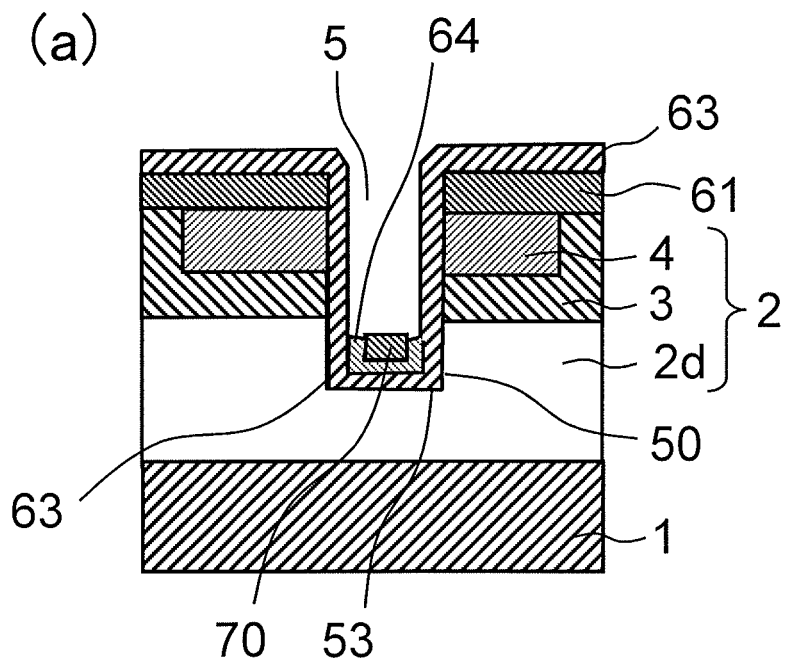
FIGS. 12 (*a*) and (*b*) are cross-sectional views illustrating alternative manufacturing process steps to fabricate a silicon carbide semiconductor device according to the second embodiment.
Figure 12:
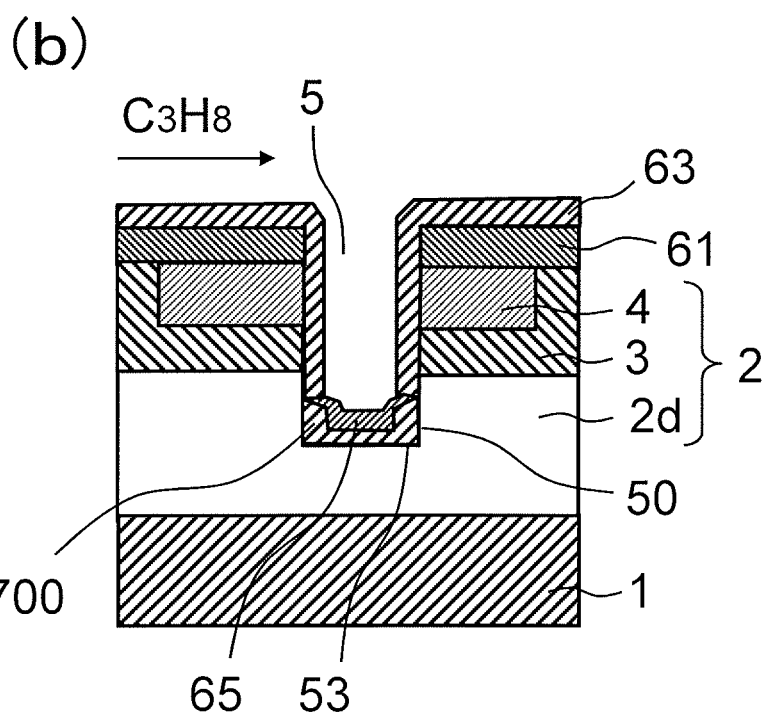

Thereafter, as shown in FIG. 12(a), the aluminum film 64 is etched through the mask 70 with a solution including phosphoric acid, for example. The etching process is performed under such a condition that only the aluminum film 64 is etched and that the silicon film 63 is not etched. In this manner, the aluminum film 64 is left only on the bottom of the trench 53 and on a portion of the side surface of the trench 50 around the bottom of the trench 53. Meanwhile, the silicon film 63 is not etched, and therefore, is left on the bottom of the trench 53 and side surface 50.

Next, as shown in FIG. 12(b), the mask 70 is removed by being exposed to plasma of a gas including oxygen, for example. Thereafter, in a heating furnace to which an argon gas is introduced at a rate of 100 liters per minute and a $C_3H_8$ gas is introduced at a rate of 150 cc per minute, the substrate 1 on which the stack has been formed on the bottom of the trench 53 is heated to a temperature of about 1100° C. to about 1200° C., for example. As a result of heating, the silicon film 63 and aluminum film 64 are melted together to form a molten film 65 only on the bottom of the trench 5. In this process step, pyrolysis of $C_3H_8$ in the ambient is produced, thus supplying carbon (C) to the molten film 65. The carbon supplied to the molten film 65 diffuses through the molten film 65 and reaches the bottom of the trench 53. And when the carbon that has reached the bottom of the trench 53 reacts with silicon and aluminum in the molten film 65, silicon carbide doped with aluminum epitaxially grows selectively at the bottom of the trench 53. In this manner, a trench bottom impurity layer 700 is formed selectively only on the bottom of the trench 53 and on a lower portion of the side surface of the trench 50 around the bottom. The heating process may be conducted for 30 minutes, for example. In this process step, if a silicon carbide substrate, of which the principal surface is either a (0001) plane or a (000-1) plane, is used as the substrate 1, the trench bottom impurity layer 700 on the side surface of the trench 50 will be approximately five times as thick as the trench bottom impurity layer 700 on the bottom of the trench 53.

As a result of this heating process, a portion of the silicon film 63 which does not contact with the aluminum film 64 is left as it is as the silicon film 63. Also, as in the example illustrated in FIG. 12, a portion of the molten film 65 which has not reacted with carbon could be left as an unreacted portion on the trench bottom impurity layer 700.

The gas to be introduced does not have to be $C_3H_8$ but may also be any other gas as long as it includes carbon and is decomposed at a temperature of 1100° C. to 1200° C. Although it depends on the annealing condition, the trench's structure, and other factors, the trench bottom impurity layer 700 of this example may have a carrier concentration of the order of $10^{19}$ cm$^{-3}$ to $10^{21}$ cm$^{-3}$ (i.e., from $10^{19}$ cm$^{-3}$ to less than $10^{22}$ cm$^{-3}$). This trench bottom impurity layer 700 lattice-fits with silicon carbide on the bottom of the trench 53 and side surface 50 but is a film including a lot of dislocations.

As can be seen, by performing this heat treatment process, the trench bottom impurity layer 700 can be formed so as to contact with only a lower portion of the side surface of the trench 50 and to cover the bottom of the trench 53 entirely.

According to this modified example, in the process step of forming a trench bottom impurity layer 700, the silicon film 63 is left over the entire surface of the trench 5. There is the silicon film 63 on the side surface of the trench 50. Since the silicon film 63 functions as a protective film, not only diffusion of carbon into a portion to be channel region (i.e., the body region 3) but also dissociation of silicon (Si) from hydrocarbon during the heat treatment process can be minimized.

After the heat treatment process has been carried out, the silicon film 63 is removed by being etched with a solution including fluonitric acid, for example.

After that, the same process steps as the ones illustrated in FIGS. 10(a) and 10(b) for the second embodiment and the ones illustrated in FIGS. 5(b) and 6 for the first embodiment will be performed, and description thereof will be omitted herein.

In this manner, a silicon carbide semiconductor device 200 is obtained as a MISFET with a trench gate structure as shown in FIG. 11.

Embodiment 3

Structure of Silicon Carbide Semiconductor Device

Next, an exemplary silicon carbide semiconductor device according to a third embodiment of the present disclosure will be described with reference to the accompanying drawings.

FIG. 13 is a cross-sectional view schematically illustrating an exemplary cross-sectional structure of a single unit cell in a silicon carbide semiconductor device 300 according to this embodiment. The silicon carbide semiconductor device 300 of this embodiment includes a channel layer 12 of the first conductivity type, which is a difference from the silicon carbide semiconductor device 100 of the first embodiment. In FIG. 13, any component also included in the silicon carbide semiconductor device 100 shown in FIG. 1 and having substantially the same function as its counterpart is identified by the same reference numeral as its counterpart's and description thereof will be omitted herein.

As shown in FIG. 13, the silicon carbide semiconductor device 300 of this embodiment includes a channel layer 12 of silicon carbide of a first conductivity type (e.g., N-type in this embodiment) between the side surface of the trench 50 and trench bottom impurity layer 7 and the gate insulating film 8. The channel layer 12 may have a carrier concentration of $1 \times 10^{18}$ cm$^{-3}$ and a thickness of 20 nm, for example. It should be noted that the carrier concentration (dopant concentration) of the channel layer 12 is suitably higher than that of the drift region 2d. And the carrier concentration (dopant concentration) of the channel layer 12 is suitably higher than that of the trench bottom impurity layer 7, too.

The channel layer 12 can achieve the effect of preventing a depletion layer from being produced in the drift region 2d of the first conductivity type between the body region 3 of the second conductivity type and the trench bottom impurity layer 7 of the second conductivity type. Thus, an increase in ON-state resistance can be checked more securely than when the structure of the silicon carbide semiconductor device 100 shown in FIG. 1 is adopted.

It should be noted that as long as the channel layer 12 includes a layer with a higher carrier concentration than the drift region 2d, it does not matter whether the channel layer 12 has a single-layer structure or a multilayer structure. Also, the thickness of the channel layer 12 could be adjusted appropriately according to the designed value of a gate threshold voltage.

A portion of the channel layer 12 which is located between the gate insulating film 8 and the body region 3 functions as a channel.

In the example illustrated in FIG. 13, the trench bottom impurity layer 7 has the same shape as its counterpart of the silicon carbide semiconductor device 100 of the first embodiment. However, this is just an example. Alternatively, the trench bottom impurity layer 7 of the silicon carbide semiconductor device 300 of this embodiment may have the same shape as its counterpart of the silicon carbide semiconductor device 200 of the second embodiment.

Method for Fabricating Silicon Carbide Semiconductor Device

Next, a method for fabricating a silicon carbide semiconductor device 300 according to this embodiment will be described.

The first half of the manufacturing process from the step of providing a substrate 1 including a silicon carbide layer 2 through the step of forming a trench bottom impurity layer 7 are the same as the process steps which are respectively shown in FIGS. 2(a) through 4(b) for the first embodiment, and description thereof will be omitted herein.

After the trench bottom impurity layer 7 has been formed, a channel layer 12 of silicon carbide is formed inside the trench 5 as shown in FIG. 14(a). Specifically, a channel layer 12 of silicon carbide of the first conductivity type (e.g., N-type in this embodiment) and with a carrier concentration of about $1 \times 10^{18}$ cm$^{-3}$ is formed on the side surface of the trench 50 and on the trench bottom impurity layer 7. In this example, the channel layer 12 is formed so as to cover the source region 4 and body region 3 on the side surface of the trench 50. It should be noted that the channel layer 12 just needs to be formed to cover the body region 3 on the side surface of the trench 50 to say the least. Optionally, the channel layer 12 may be formed not only inside the trench 5 but also on a portion of the upper surface 52 of the silicon carbide layer 2 around the trench 5 as well.

To form the channel layer 12, a silicon-based gas (such as silane gas), a carbon-based gas (such as propane gas) and a dopant gas (such as nitrogen gas if it needs to be N-type) are supplied and the substrate is heated to a temperature of 1400° C. to 1700° C. using a CVD system, for example.

Figure 14:
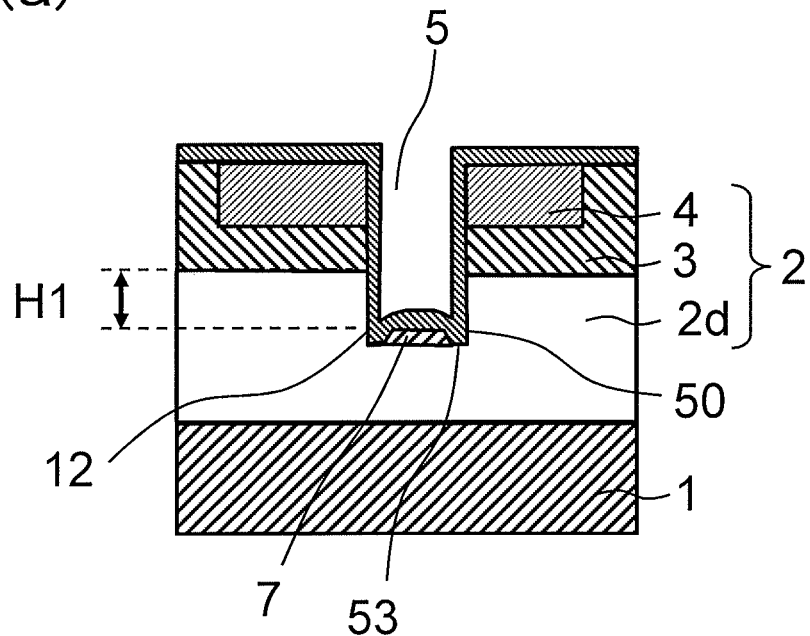
FIGS. 14 (*a*) and (*b*) are cross-sectional views illustrating respective manufacturing process steps to fabricate the silicon carbide semiconductor device 300.
Figure 14:
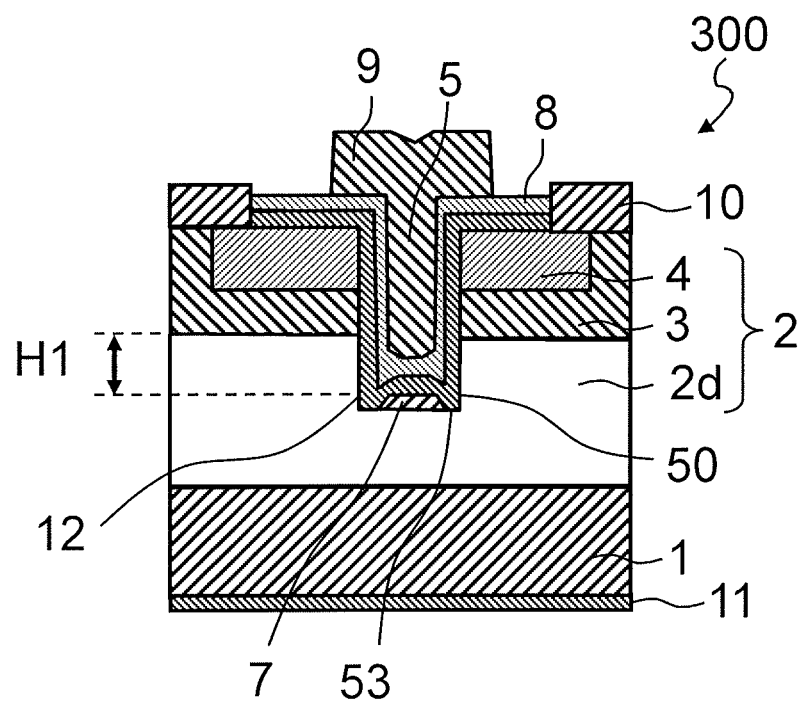

Next, inside the trench 5, a gate insulating film 8 is formed on the channel layer 12. The gate insulating film 8 may be formed by thermal oxidation as in the process step shown in FIG. 5(a), for example. In the process step shown in FIG. 5(a), surface portions of the trench bottom impurity layer 7 and silicon carbide layer 2 are thermally oxidized. In this embodiment, on the other hand, a surface portion of the channel layer 12 is thermally oxidized. The process condition on which the thermal oxidation is carried out may be the same as what has already been described with reference to FIG. 5(a). In this example, the gate insulating film 8 is also formed thicker at the corner portion and bottom of the trench 5 than anywhere else. As shown in FIG. 14, as viewed on a plane which intersects with the substrate 1 at right angles, depending on the shape of the trench bottom impurity layer 7, the angle formed between respective portions of the channel layer 12 on the side surface of the trench 50 and bottom 53 may decrease at the corner portion of the trench 5. As a result, thermal oxide films which have been formed on the surface of the channel layer 12 may contact with each other on the side surface of the trench 50 and bottom 53, thus forming an even thicker oxide film. In addition, depending on the shape of the trench bottom impurity layer 7, the channel layer 12 may have a raised surface, for example, at the bottom of the trench 53. Thus, compared to a situation where the channel layer 12 has a flat surface, the surface area increases. Consequently, a thermal oxide film which is thicker than on the side surface of the trench 50 on which the channel layer 12 has a substantially flat surface may be formed.

After that, the same manufacturing process steps as the ones illustrated in FIG. 6 for the first embodiment are performed, and description thereof will be omitted herein.

In this manner, a silicon carbide semiconductor device 300 is obtained as a MISFET with a trench gate structure as shown in FIG. 14(b).

According to such a manufacturing process, a trench bottom impurity layer 7 can be formed only inside the trench 5 so as to be self-aligned and to cover the bottom of the trench 53. As a result, an increase in ON-state resistance that would be caused if the bottom of the trench 53 were misaligned with the trench bottom impurity layer 7 can be checked and overconcentration of an electric field at the bottom of the trench 53 can be reduced.

Furthermore, a thick gate insulating film 8 is formed at the boundary between the bottom of the trench 53 and side surface 50 and on the upper surface of the trench bottom impurity layer 7. Consequently, overconcentration of an electric field at the bottom of the trench 53 can be reduced more securely, and dielectric breakdown of the gate insulating film 8 at the bottom of the trench 53 can be suppressed.

In addition, in the method for fabricating a silicon carbide semiconductor device according to this embodiment, a channel layer 12 of the first conductivity type is formed between the side surface of the trench 50 and the gate insulating film 8, and therefore, it is possible to prevent a depletion layer from being produced in the drift region 2d of the first conductivity type between the body region 3 of the second conductivity type and the trench bottom impurity layer 7 of the second conductivity type. Consequently, compared to the structure of the silicon carbide semiconductor device 100 shown in FIG. 1, the increase in ON-state resistance can be checked more securely.

According to the manufacturing process of the embodiment described above, in the process step of forming a stack, after a silicon film 63 has been formed on the bottom of the trench 53, an aluminum film 64 is formed on the silicon film 63. However, this is only an example. Alternatively, after an aluminum film 64 has been formed on the bottom of the trench 53, a silicon film 63 may be formed on the aluminum film 64.

Also, in the foregoing description of embodiments, a vertical MISFET with a trench gate structure has been described as a typical example. However, the trench bottom impurity layer of any of the embodiments described above is also applicable to any other type of silicon carbide semiconductor device with a trench gate structure.

For example, if the substrate and the silicon carbide layer formed right on the substrate have mutually different conductivity types, then an insulated gate bipolar transistor (IGBT) can be formed. In the case of an IGBT, however, the source electrode 10, drain electrode 11 and source region 4 described above are called an "emitter electrode", a "collector electrode" and an "emitter region", respectively.

Thus, if in the silicon carbide semiconductor device described above, the conductivity type of its drift region and emitter region is set to be N-type and the conductivity type of its substrate and body region is set to be P-type, an N-type IGBT can be obtained. In that case, an N-type buffer layer may be arranged between the P-type substrate and the N-type drift region. Conversely, if the conductivity type of its drift region and emitter region is set to be P-type and the conductivity type of its substrate and body region is set to be N-type, a P-type IGBT can be obtained. In that case, a P-type buffer layer may be arranged between the N-type substrate and the P-type drift region.

Also, in the embodiments described above, a plurality of unit cells are supposed to be arranged in parallel with each other. However, those unit cells may also be arranged in any other pattern.

Furthermore, in the example described above, the trenches 5 are supposed to have a rectangular planar shape and the unit cells are supposed to be arranged so that the longer sides of those trenches are parallel to each other. However, the trenches do not have to have such a planar shape but may also have a square planar shape, for example.

Furthermore, in the example described above, the substrate 1 is supposed to be made of 4H-silicon carbide, and its principal surface is supposed to be a (0001) Si plane, on which a silicon carbide layer 2 is supposed to be arranged. However, the silicon carbide layer 2 may also be arranged on a (000-1) C plane, and the drain electrode 11 may also be arranged on a (0001) Si plane. Moreover, the principal surface may have any other crystallographic plane orientation and an arbitrary off-cut plane of the Si or C plane described above may be used as the principal surface of the substrate. Still alternatively, a silicon carbide substrate of any other poly-type may also be used.

Optionally, in the process step of forming a trench bottom impurity layer, an etching process may be performed within a hydrogen ambient (which will be hereinafter referred to as a "hydrogen etching process") after the heating process has been carried out. Particularly, in the process step of forming a trench bottom impurity layer 700 without covering the side surface of the trench with the protective film 62 (in the second and third embodiments), a silicon carbide epitaxial layer of the second conductivity type may be formed unintentionally on the side surface of the trench. Even so, the silicon carbide epitaxial layer of the second conductivity type that has been formed on the side surface of the trench can also be removed by performing an etching process within a hydrogen ambient. It should be noted that when the hydrogen etching process is performed, not only the silicon carbide epitaxial layer is removed from the side surface of the trench but also a surface portion of the trench bottom impurity layer 700 may be etched as well.

In addition, other parameters of the silicon carbide semiconductor device and method for fabricating the device described above, including the shapes, sizes, dopant concentrations, and materials of its members, may be changed appropriately without deviating from the scope of the present invention.

INDUSTRIAL APPLICABILITY

A silicon carbide semiconductor device and method for fabricating the device according to the present disclosure can be used effectively as any of various types of silicon carbide semiconductor devices including a power device such as a switching element and a method for fabricating such a device.

REFERENCE SIGNS LIST 1 substrate
2 silicon carbide layer
2d drift region (first impurity region)
3 body region
4 source region (second impurity region)
5 trench
7, 700 trench bottom impurity layer
8 gate insulating film
9 gate electrode
10 source electrode 11 drain electrode
11 channel layer
50 side surface of trench
52 upper surface of silicon carbide layer
53 bottom of trench
61, 70 mask
62 protective film
63 silicon film
64 aluminum film
65 molten film
100, 200, 300 silicon carbide semiconductor device
100U unit cell

The invention claimed is:
1. A silicon carbide semiconductor device comprising:
a substrate with a principal surface;
a silicon carbide layer which is arranged on a side of the principal surface of the substrate and which includes a first impurity region of a first conductivity type;
a trench which is arranged in the silicon carbide layer and which has a bottom located in the first impurity region;
a trench bottom impurity layer which is arranged in the trench to contact with at least a portion of the bottom of the trench and which is a silicon carbide epitaxial layer of a second conductivity type;
a gate insulating film which covers a side surface of the trench and the trench bottom impurity layer; and
a gate electrode which is arranged over at least a portion of the gate insulating film, the portion of the gate insulating film being located in the trench,
wherein the trench bottom impurity layer is out of contact with the side surface of the trench,
wherein an upper surface of the trench bottom impurity layer has an upwardly raised shape, and
wherein the density of dislocations which extend in the trench bottom impurity layer in its growing direction from the lower surface toward the upper surface of the trench bottom impurity layer is higher than the density of dislocations which extend in the first impurity region in a growing direction of the silicon carbide layer.

2. The silicon carbide semiconductor device of claim 1, wherein the trench bottom impurity layer is arranged only in the trench.

3. The silicon carbide semiconductor device of claim 1, wherein the trench bottom impurity layer includes aluminum as an impurity.

4. The silicon carbide semiconductor device of claim 1, wherein a portion of the gate insulating film which is located at a boundary between the bottom and the side surface of the trench is thicker than another portion of the gate insulating film which is located on the side surface of the trench.

5. The silicon carbide semiconductor device of claim 1, wherein the gate insulating film is thicker on the trench bottom impurity layer than on the side surface of the trench.

6. The silicon carbide semiconductor device of claim 1, wherein the gate insulating film is a thermal oxide film.

7. The silicon carbide semiconductor device of claim 1, wherein the first impurity region is a drift region,
the silicon carbide layer further includes:
a body region of the second conductivity type which is arranged over the drift region; and
a second impurity region of the first conductivity type which is arranged over the body region, and
the trench penetrates the second impurity region and the body region to reach the inside of the drift region.

8. The silicon carbide semiconductor device of claim 7, wherein an upper surface of the trench bottom impurity layer is located under an interface between the drift region and the body region.

9. The silicon carbide semiconductor device of claim 7, further comprising a channel layer which is arranged at least between the body region and the gate insulating film and which is made of silicon carbide of the first conductivity type.

10. A silicon carbide semiconductor device comprising:
a substrate with a principal surface;
a silicon carbide layer which is arranged on a side of the principal surface of the substrate and which includes a first impurity region of a first conductivity type;
a trench which is arranged in the silicon carbide layer and which has a bottom located in the first impurity region;
a trench bottom impurity layer which is arranged in the trench to contact with at least a portion of the bottom of the trench and which is a silicon carbide epitaxial layer of a second conductivity type;
a gate insulating film which covers a side surface of the trench and the trench bottom impurity layer; and
a gate electrode which is arranged over at least a portion of the gate insulating film, the portion of the gate insulating film being located in the trench,
wherein the trench bottom impurity layer is arranged to cover the bottom of the trench entirely and is in contact with a portion of the side surface of the trench,
wherein the trench bottom impurity layer has a concave upper surface, and
wherein the density of dislocations which extend in the trench bottom impurity layer in its growing direction from the lower surface toward the upper surface of the trench bottom impurity layer is higher than the density of dislocations which extend in the first impurity region in a growing direction of the silicon carbide layer.

11. A method for fabricating a silicon carbide semiconductor device, the method comprising:
(A) providing a substrate having a silicon carbide layer including a first impurity region of a first conductivity type, the silicon carbide layer being arranged on a side of a principal surface of the substrate;
(B) forming a trench in the silicon carbide layer, a bottom of the trench being located in the first impurity region;
(C) forming a stack including a silicon film and an aluminum film on at least a portion of the bottom of the trench;
(D) conducting a heat treatment within a gas including carbon and allowing silicon and aluminum in the stack to react with the carbon, thereby forming a trench bottom impurity layer, which is a silicon carbide epitaxial layer of a second conductivity type, on at least the portion of the bottom of the trench;
(E) forming a gate insulating film on a side surface of the trench and on the trench bottom impurity layer; and
(F) forming a gate electrode on at least a portion of the gate insulating film, the portion of the gate insulating film being located in the trench,
the method further comprising, between the steps (B) and (C), the step of forming a protective film which is arranged on the side surface of the trench and which exposes the bottom of the trench at least partially,
wherein in the step (C), the stack is formed on a portion of the bottom of the trench which is exposed by the protective film and on the protective film,
in the step (D), a portion of the stack which is located on the protective film remains unreacted with the carbon, and the method further includes, between the steps (D) and (E), the step of removing the portion of the stack that remains unreacted with the carbon and the protective film.

12. The method of claim 11, wherein the step (D) includes conducting the heat treatment at a temperature of 1100° C. to 1200° C.

13. The method of claim 12, wherein the gas including carbon is a mixture of argon and propane gases.

14. The method of claim 11, wherein the step (E) includes forming the gate insulating film by thermally oxidizing a surface portion of the trench and a surface portion of the trench bottom impurity layer.

15. The method of claim 11, wherein the first impurity region is a drift region,
the silicon carbide layer further includes: a body region of the second conductivity type which is arranged over the drift region; and a second impurity region of the first conductivity type which is arranged over the body region, and
the step (B) includes forming a trench, the trench penetrating the second impurity region and the body region to reach the inside of the drift region.

16. The method of claim 15, further comprising, between the steps (D) and (E), the step of forming a channel layer which is made of silicon carbide of the first conductivity type on the body region that forms a part of the side surface of the trench.

17. A method for fabricating a silicon carbide semiconductor device, the method comprising:

(A) providing a substrate having a silicon carbide layer including a first impurity region of a first conductivity type, the silicon carbide layer being arranged on a side of a principal surface of the substrate;

(B) forming a trench in the silicon carbide layer, a bottom of the trench being located in the first impurity region;

(C) forming a stack including a silicon film and an aluminum film on at least a portion of the bottom of the trench;

(D) conducting a heat treatment within a gas including carbon and allowing silicon and aluminum in the stack to react with the carbon, thereby forming a trench bottom impurity layer, which is a silicon carbide epitaxial layer of a second conductivity type, on at least the portion of the bottom of the trench;

(E) forming a gate insulating film on a side surface of the trench and on the trench bottom impurity layer; and (F) forming a gate electrode on at least a portion of the gate insulating film, the portion of the gate insulating film being located in the trench, wherein the step (C) includes forming the stack on the bottom of the trench and side surface, and the method includes, between the steps (C) and (D), the steps of:

forming a mask to cover a portion of the stack which is located on the bottom of the trench; and removing a portion of the aluminum film by etching using the mask.

* * * * *